(12) United States Patent
Kamiya et al.

(10) Patent No.: US 7,569,448 B2
(45) Date of Patent: Aug. 4, 2009

(54) SEMICONDUCTOR DEVICE INCLUDING BIPOLAR JUNCTION TRANSISTOR WITH PROTECTED EMITTER-BASE JUNCTION

(75) Inventors: Takayuki Kamiya, Iwata (JP); Kunihiko Mitsuoka, Shizuoka-Ken (JP)

(73) Assignee: Yamaha Corporation, Shizuoka-Ken (JP)

( * ) Notice: Subject to any disclaimer, the term of this patent is extended or adjusted under 35 U.S.C. 154(b) by 22 days.

(21) Appl. No.: 11/790,837

(22) Filed: Apr. 27, 2007

(65) Prior Publication Data

US 2007/0196974 A1    Aug. 23, 2007

Related U.S. Application Data

(62) Division of application No. 11/073,762, filed on Mar. 8, 2005.

(30) Foreign Application Priority Data

Mar. 8, 2004    (JP) .............................. 2004-063982

(51) Int. Cl.
*H01L 21/8248* (2006.01)
(52) U.S. Cl. ................ 438/202; 438/234; 257/E27.032
(58) Field of Classification Search ................ 438/202, 438/353, 234; 257/E27.03, E27.031, E27.032
See application file for complete search history.

(56) References Cited

U.S. PATENT DOCUMENTS 6,215,160 B1    4/2001  Suda et al.

| | | | |
|---|---|---|---|
| 2003/0085414 A1* | 5/2003 | Okuno et al. | 257/200 |
| 2003/0155614 A1* | 8/2003 | Kaneko et al. | 257/349 |
| 2005/0098834 A1* | 5/2005 | Zheng et al. | 257/371 |
| 2006/0223257 A1* | 10/2006 | Williams et al. | 438/202 |

FOREIGN PATENT DOCUMENTS

| | | |
|---|---|---|
| JP | 62-086752 | 4/1987 |
| KR | 1998-074222 | 11/1998 |

OTHER PUBLICATIONS

Hitosho Okamura, et al.., "BiCMOS Embedded Gate Array QB-8E," NEC, vol. 49, No. 3, 1996.

* cited by examiner

*Primary Examiner*—Jerome Jackson, Jr.
*Assistant Examiner*—Paul A Budd
(74) *Attorney, Agent, or Firm*—Dickstein Shapiro LLP

(57) ABSTRACT

A method of manufacturing a CMOS-BJT semiconductor device comprises the steps of: forming a collector region of a first conductivity type and a first well of the first conductivity type, simultaneously in a semiconductor substrate; forming a second well of a second conductivity type opposite to said first conductivity type, in the semiconductor substrate; forming a base region of the second conductivity type in the collector region; forming first and second insulated gate structure on said first and second wells, and a junction protection structure having same constituent elements as said insulated gate structures on said base region; and forming second source/drain regions of the first conductivity type in said second well, and an emitter region of the first conductivity type in the base region, simultaneously, with an emitter-base junction reaching the principal surface below said junction protection structure.

12 Claims, 18 Drawing Sheets

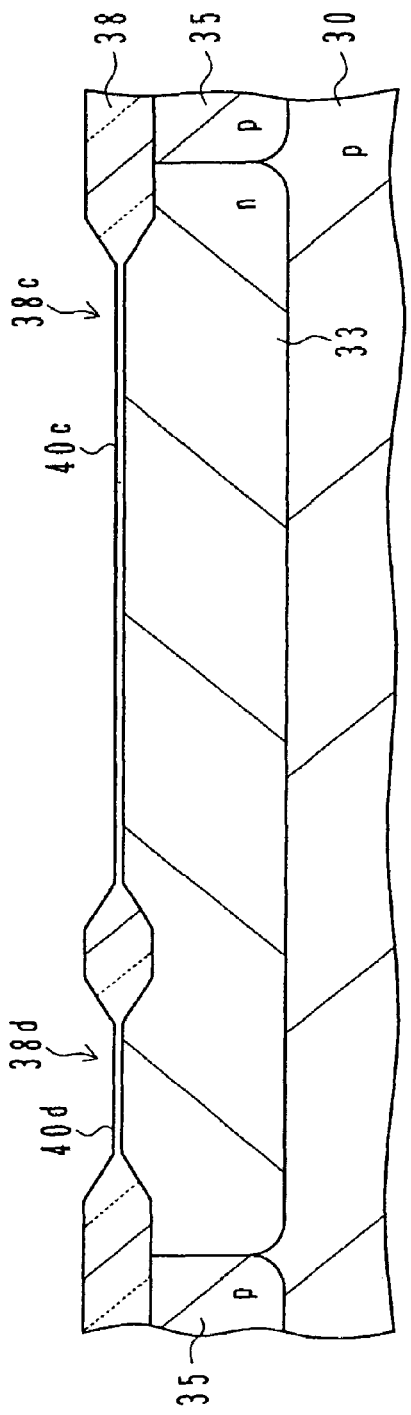
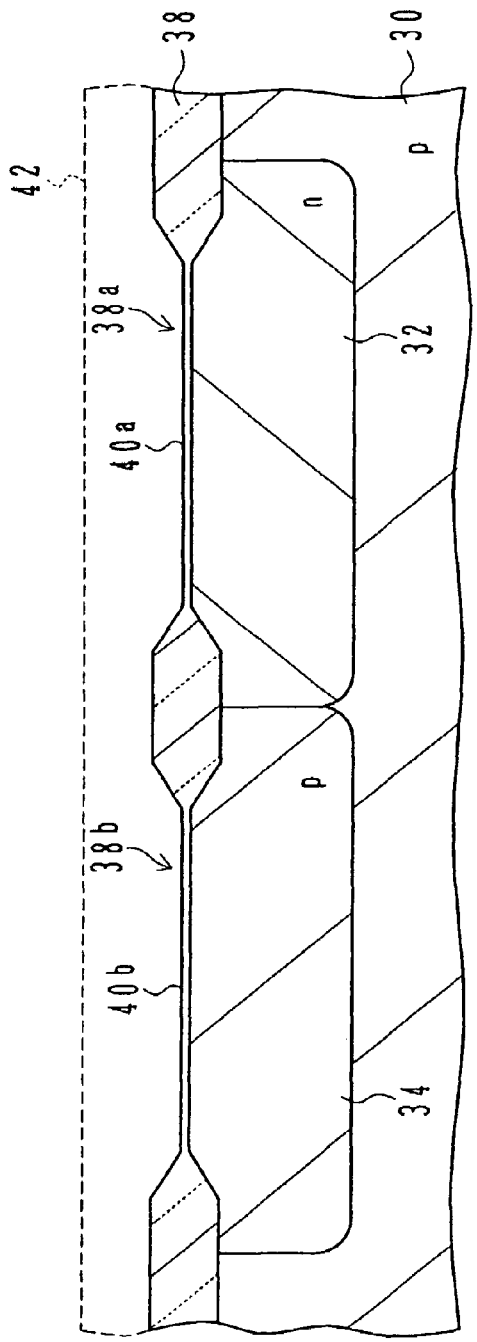
FIG.4A
FIG.4B

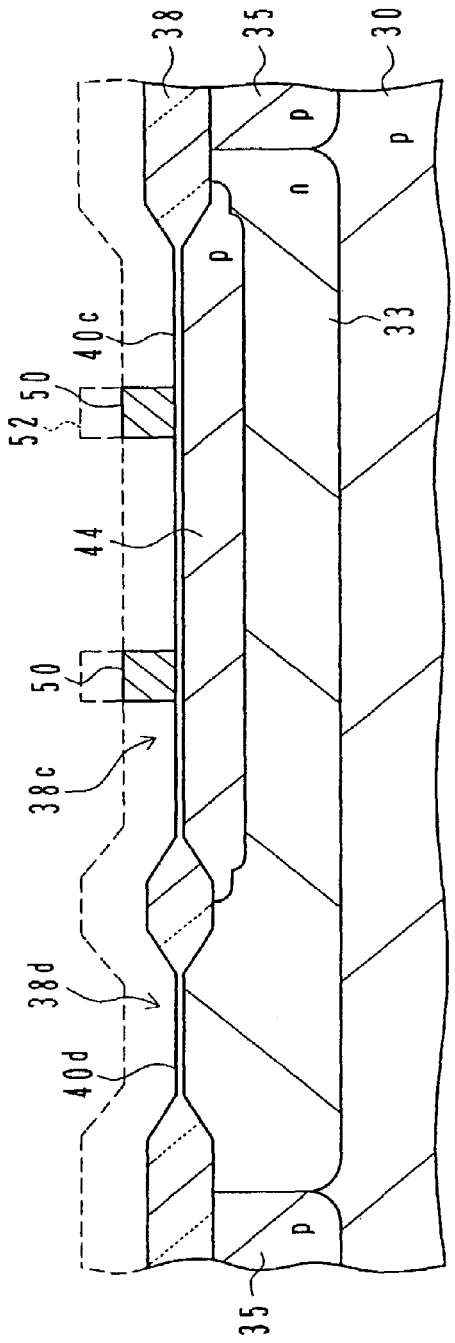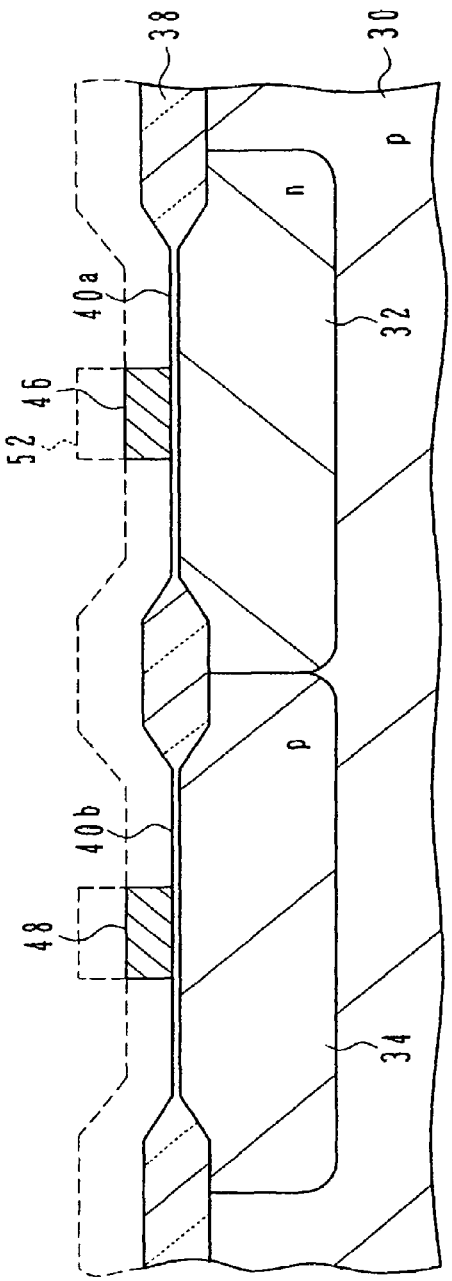

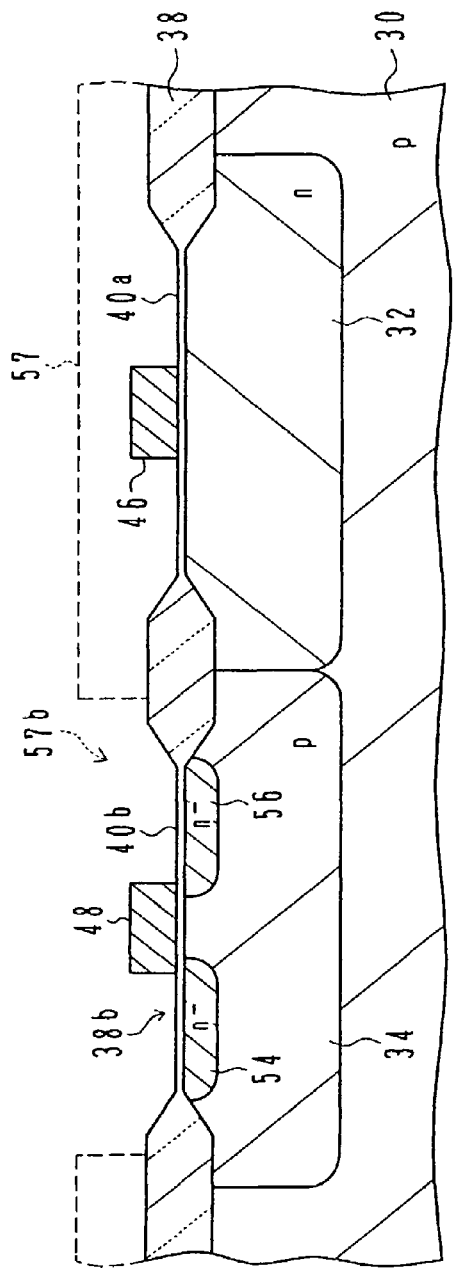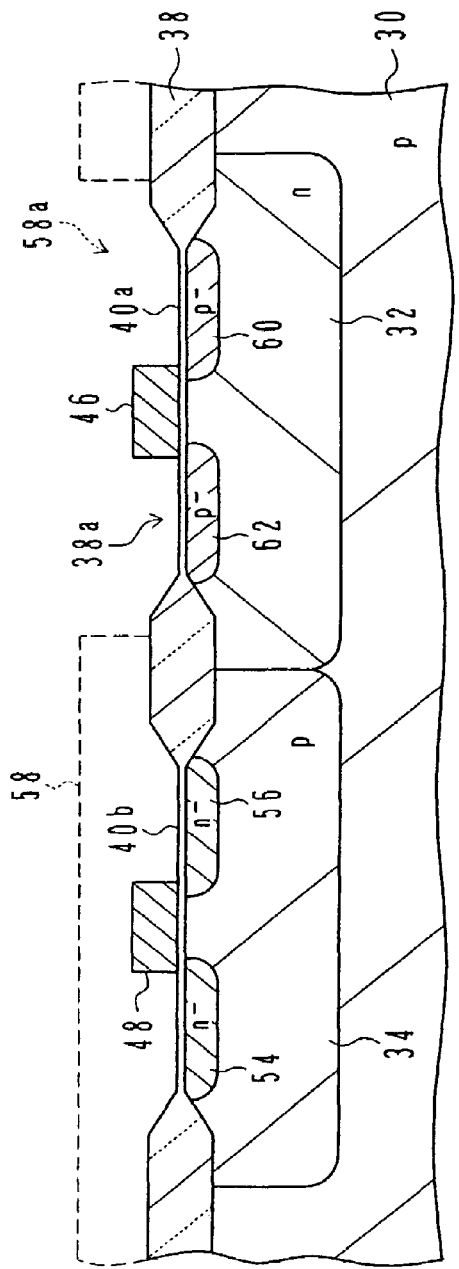

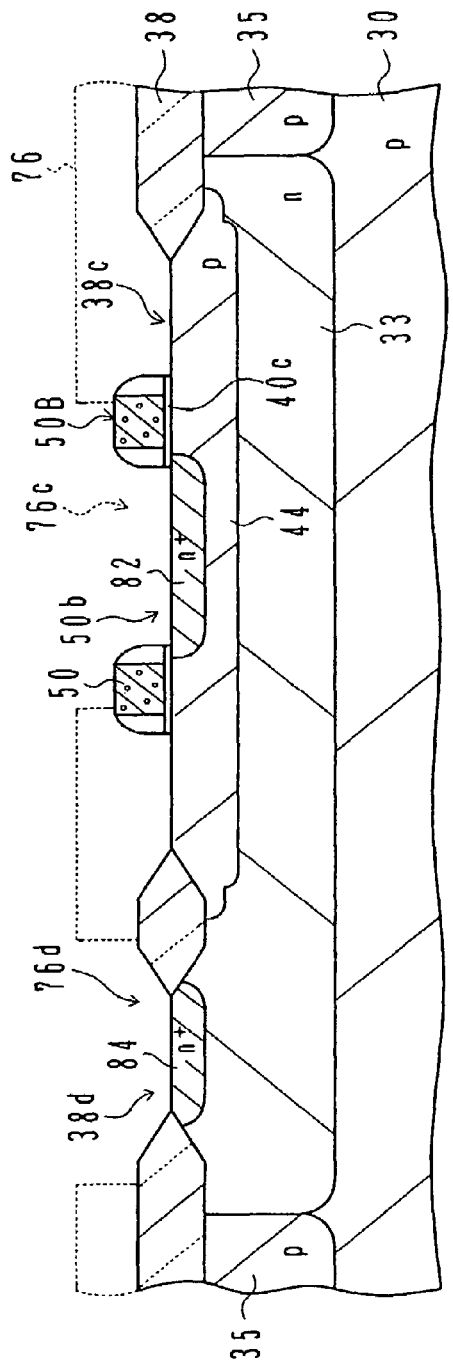
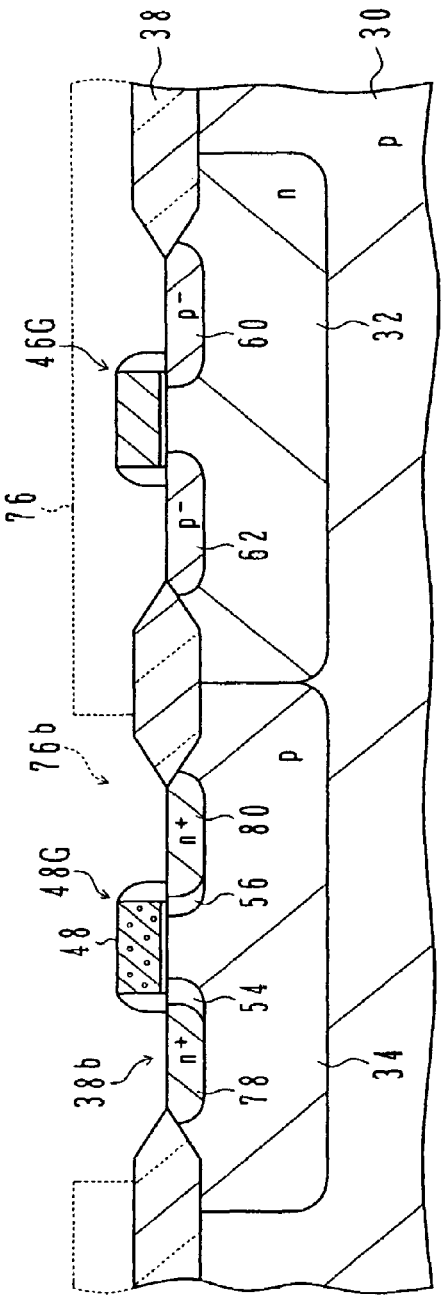

SEMICONDUCTOR DEVICE INCLUDING BIPOLAR JUNCTION TRANSISTOR WITH PROTECTED EMITTER-BASE JUNCTION

CROSS REFERENCE TO RELATED APPLICATION

This application is continuation of U.S. patent application Ser. No. 11/073,762, filed Mar. 8, 2005, claiming priority to Japanese Patent Application No. 2004-63982 filed on Mar. 8, 2004, the entirety of which are incorporated herein by reference.

BACKGROUND OF THE INVENTION

A) Field of the Invention

The present invention relates to a semiconductor device and its manufacture method, and more particularly to complementary MOS (CMOS) transistors and bipolar junction transistors (BJT) and their manufacture method.

B) Description of the Related Art

A manufacture method shown in FIGS. 13 to 22 is known as a conventional manufacture method for a bipolar junction transistor (e.g., refer to Japanese Patent Laid-open Publication No. SHO-62-86752 which is incorporated herein by reference).

In the process shown in FIG. 13, in a p-type silicon substrate 1 having a principal surface, an n-type collector region 2 is formed from the principal surface down into the substrate. The n-type well region 2 is formed by the same process as the process of forming an n-type well of a p-channel MOS transistor in a CMOS transistor area. After a field oxide film 3 is formed having an element aperture 3a corresponding to a portion of the collector region 2, a thin oxide film 4 is formed on the silicon surface exposed in the element aperture 3a. The oxide film 3 is formed by the same process as the local oxidation of silicon (LOCOS) process of forming a field oxide film in the CMOS transistor area, and the oxide film 4 is formed by the same process as the thermal oxidation process of forming a gate oxide film in the CMOS transistor area.

Next, in the surface layer of the collector region 2, a p-type active base region 6 is formed by an ion implantation process using a resist layer 5 and the insulating film 3 as a mask. During this process, the CMOS transistor area is masked with the resist layer 5. The ion implantation process includes heat treatment for activating implanted ions, and this heat treatment may be performed after ion implantation is performed once or it may be performed after ion implantation is performed a plurality of times (e.g., after all ion implantation is performed). Description of this heat treatment is omitted unless it is specifically required.

In the process shown in FIG. 14, the oxide films 3 and 4 are selectively etched by using the resist layer 5 as a mask to expose a main surface area of the active base region 6. The resist layer 5 is thereafter removed.

In the process shown in FIG. 15, a polysilicon layer 7A and a silicon oxide layer 8A are sequentially deposited on the substrate by chemical vapor deposition (CVD). Into the polysilicon layer 7A, n-type impurities for forming an emitter region are doped at a concentration of $10^{21}$ cm$^{-3}$ during or after deposition.

In the process shown in FIG. 16, a lamination of the polysilicon layer 7A and silicon oxide layer 8A is patterned in an emitter electrode shape by the etching process using a resist layer (not shown) as a mask, to thereby leave a portion 7 of the polysilicon layer 7A and a portion 8 of the silicon oxide layer 8A in a stacked state.

The processes shown in FIG. 15 and 16 are executed by using the same processes as those of forming a gate electrode in the CMOS transistor area. After the process shown in FIG. 16, in the CMOS transistor area, low concentration (p$^-$-type or n$^-$-type) source/drain regions of at least one of an n-channel and p-channel MOS transistors are formed by using as a mask a gate stacked layer (corresponding to the stacked layer of the polysilicon layer 7 and silicon oxide layer 8).

In the process shown in FIG. 17, on the upper surface of the substrate, a silicon oxide layer 9 is deposited by CVD. In the process shown in FIG. 18, the silicon oxide layer 9 is etched back by reactive ion etching (RIE) to form side wall spacers 9a and 9b on the side walls of the stacked layer of the polysilicon layer 7 and silicon oxide layer 8. The side wall spacers 9a and 9b are both made of the left silicon oxide layer 9. The processes shown in FIGS. 17 and 18 are executed by the same processes as the process of forming a side wall spacer in the CMOS transistor area. The structure having the polysilicon layer 7, silicon oxide layer 8 and side wall spacers 9a and 9b shown in FIG. 18 is hereinafter called an emitter electrode structure 10.

In the process shown in FIG. 19, an n$^+$-type collector contact region 12 is formed in a surface layer of the collector region 2 by an ion implantation process using as a mask a resist layer 11 and an insulating film 3. The n$^+$-type region 12 is formed by using the same process as the ion implantation process of forming n$^+$-type source/drain regions of an n-channel MOS transistor in the CMOS transistor area. After the resist layer 11 is removed, an n$^+$-type emitter region 13 is formed in the surface layer of the active base region 6 by heat treatment for activating implanted ions, by using as a diffusion source the polysilicon layer 7 of the emitter electrode structure 10.

In the process shown in FIG. 20, a p$^+$-type external base region 15 is formed by an ion implantation process using a resist layer 14 as a mask, the external base region overlapping a partial area of the active base region 6. The p$^+$-type region 15 is formed by using the same process as an ion implantation process of forming p$^+$-type source/drain regions of a p-channel MOS transistor in the CMOS transistor area. The resist layer 14 is thereafter removed.

In the process shown in FIG. 21, a silicon oxide layer 16 is deposited on the substrate upper surface by CVD.

In the process shown in FIG. 22, contact holes 16e, 16b and 16c corresponding to the emitter, base and collector are formed through the silicon oxide layer 16. The contact hole 16e corresponding to the emitter is formed in such a manner that the polysilicon layer 7 is exposed by removing the silicon oxide layer 8 of the emitter electrode structure 10. Metal such as Al alloy is coated on the substrate upper surface and the coated layer is patterned to form an emitter electrode layer 17, a base electrode layer 18 and a collector electrode layer 19. The electrode layers 17, 18 and 19 are connected to the polysilicon layer 7, external base region 15 and collector contact region 12, respectively, via the contact holes 16e, 16b and 16c.

The process shown in FIG. 21 is executed by using the same process as a process of depositing silicon oxide in the CMOS transistor area. The process shown in FIG. 22 is executed by using the same process as a process of forming an electrode in the CMOS transistor area.

The above-described conventional techniques require the processes specific to a bipolar transistor manufacture method (processes unable to use the CMOS transistor processes), i.e., the active base region forming process of FIG. 13 and the oxide film removing process of FIG. 14, and have an increased number of processes.

During a dry etching for patterning the stacked layer of the polysilicon layer 7 and silicon oxide layer 8 in the process shown in FIG. 16, the surface of the active base region 6 is exposed to etching and damaged. Therefore, as the emitter region 13 is formed in the surface layer of the active base region 6 as shown in FIG. 19, leak current at the pn junction (emitter-base junction) between the emitter region 13 and base region 6 increases and a current amplification factor $h_{FE}$ lowers.

SUMMARY OF THE INVENTION

An object of this invention is to provide a semiconductor device including a bipolar junction transistor with a protected emitter-base junction, and a method of manufacturing the same.

Another object of this invention is to provide a semiconductor device including CMOS transistors, and a bipolar junction transistor with a protected emitter-base junction, and a method of manufacturing the same, without excessively increasing the number of manufacturing steps.

According to one aspect of this invention, there is provided a semiconductor device including a bipolar junction transistor, comprising:
  a semiconductor substrate having a principal surface;
  a collector region of a first conductivity type formed in said semiconductor substrate from said principal surface;
  a base region of a second conductivity type opposite to said first conductivity type, formed in said collector region from said principal surface;
  an emitter region of said first conductivity type, formed in said base region from said principal surface, forming an emitter-base junction reaching said principal surface; and
  [a] junction protection structure formed above said emitter-base junction reaching the principal surface comprising an insulator film formed on said principal surface, and a conductive electrode formed on said insulator film.

Preferably the semiconductor device includes CMOS transistors, comprising first and second wells of the first and the second conductivity types formed in said semiconductor substrate from said principal surface, first and second insulated gate structures formed on said first and second wells, including first and second gate insulating films formed on said first and second wells, first and second conductive electrodes formed on said first and second gate insulating films and having side walls, and first and second side wall spacers formed on side walls of said first and second conductive electrodes, first and second source/drain regions formed in said first and second wells on both sides of said first and second insulated gate structures, and having the second and first conductivity types, wherein said junction protection structure has same constituent elements as, and formed simultaneously with one of said insulated gate structures. Preferably, the collector region and the first well are simultaneously formed, and said emitter region and said second source/drain regions are simultaneously formed. The base region may have a surface exposed at the principal surface in a base aperture of a field insulating film, the junction protection structure has a closed loop configuration within the base aperture, and the emitter may be formed in a region defined by the closed loop configuration with an emitter-base junction reaching the principal surface below the junction protection structure. The junction protection structure may traverse the base region defined in the base aperture, and the emitter region may be formed in a region defined by the junction protection structure and the field insulating film, with an emitter-base junction reaching the principal surface below the junction protection structure, and the field insulating film.

According to another aspect of this invention, there is provided a method of manufacturing a semiconductor device including CMOS transistors and a bipolar junction transistor, comprising the steps of:
  (a) preparing a semiconductor substrate having a principal surface;
  (b-1) forming a collector region of a first conductivity type and a first well of the first conductivity type, simultaneously in the semiconductor substrate from the principal surface;
  (b-2) forming a second well of a second conductivity type opposite to said first conductivity type, in the semiconductor substrate from the principal surface;
  (c) forming a base region of the second conductivity type in the collector region from the principal surface;
  (d) forming first and second insulated gate structure[s] on said first and second wells, and a junction protection structure having [a] same constituent elements as one of said insulated gate structures on said base region;
  (e-1) forming first source/drain regions of the second conductivity type in said first well on both sides of said first insulated gate structure(s); and
  (e-2) forming second source/drain regions of the first conductivity type in said second well on both sides of said second insulated gate structure(s), and an emitter region of the first conductivity type in the base region with an emitter-base junction reaching the principal surface below said junction protection structure, the second source/drain regions and the emitter region being formed simultaneously.

Preferably, the first and second insulated gate structures and the junction protection structure, each comprising an insulating film formed on the principal surface, a conductive electrode formed on the insulating film, and side wall spacers of insulating material formed on side walls of said conductive electrode. When the junction protection structure has a closed loop configuration, the emitter region may be formed in the region surrounded by the closed loop configuration. When the junction protection structure traverses a base region exposed in a base aperture of a field insulating film, the emitter region may be formed in a region defined by the junction protection structure and the field insulating film.

According to this manufacture method, only the process of forming the base region is a bipolar junction transistor forming process, and the other processes are the same as complementary MOS transistor forming processes.

Since leak current at the emitter-base pn junction can be reduced, a current amplification factor $H_{FE}$ can be improved. Since a base resistance can be lowered, the high frequency characteristics can be improved. Since the processes other than the base region forming process use the same processes as complementary MOS transistor manufacture processes, the number of manufacture processes can be reduced.

BRIEF DESCRIPTION OF THE DRAWINGS

FIGS. 4A and 4B to FIG. 10 are cross sectional views illustrating a method of manufacturing a semiconductor device according to an embodiment of the present invention.

DESCRIPTION OF THE PREFERRED EMBODIMENTS

Prior to the description of embodiments, preliminary studies made by the present inventors will be described.

Figure 1:
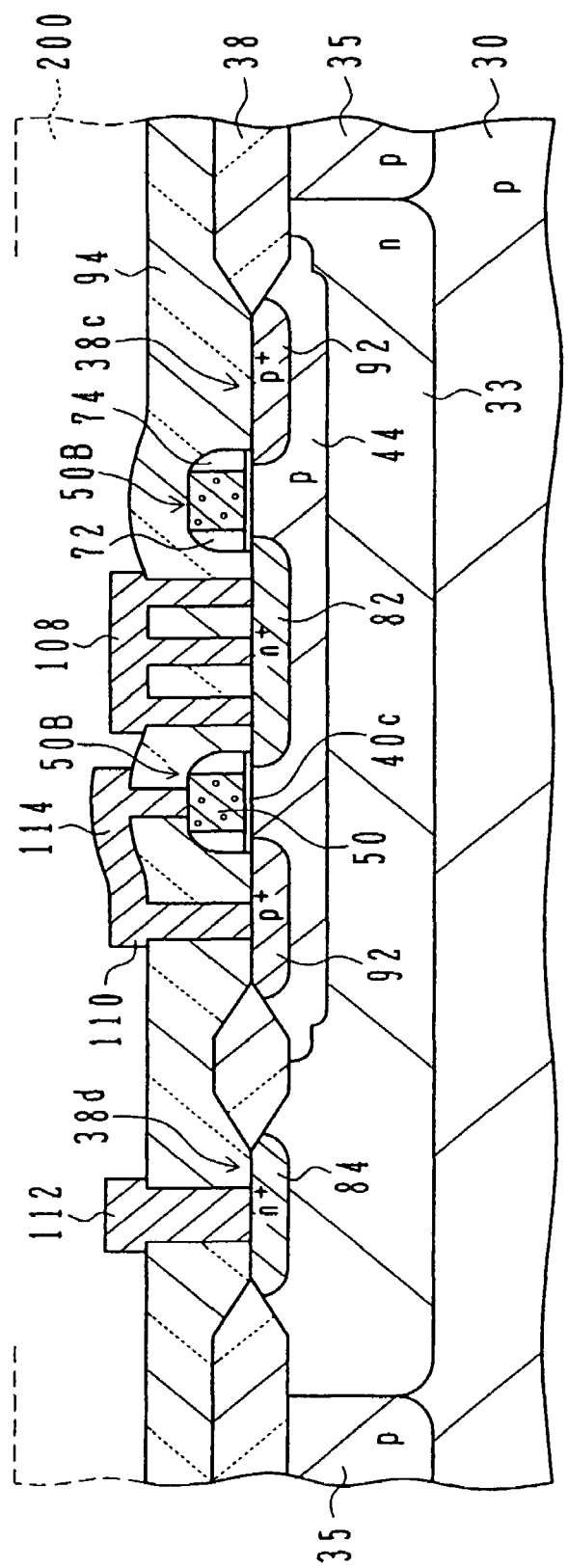
FIG. 1 is a cross sectional view showing a bipolar transistor region of a BiCMOSIC according to an embodiment of the invention.
Figure 2:
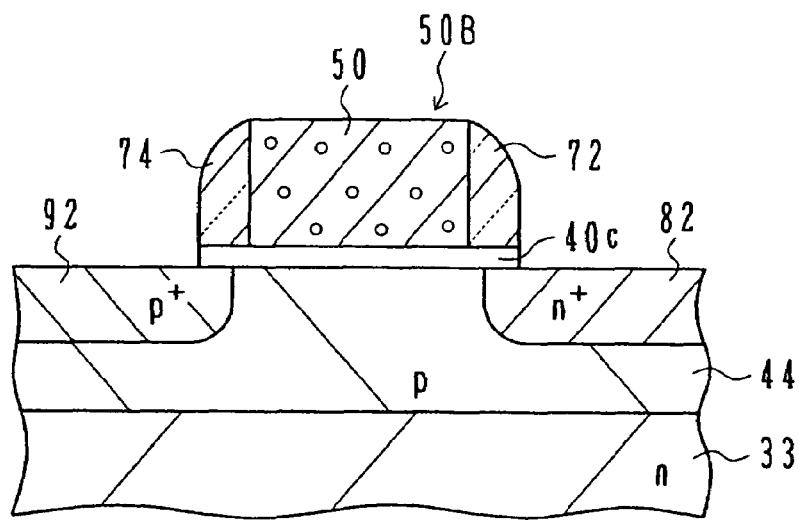
FIG. 2 is an enlarged cross sectional view showing a junction protection structure of the bipolar transistor region shown in FIG. 1, and its nearby region.
Figure 3A:
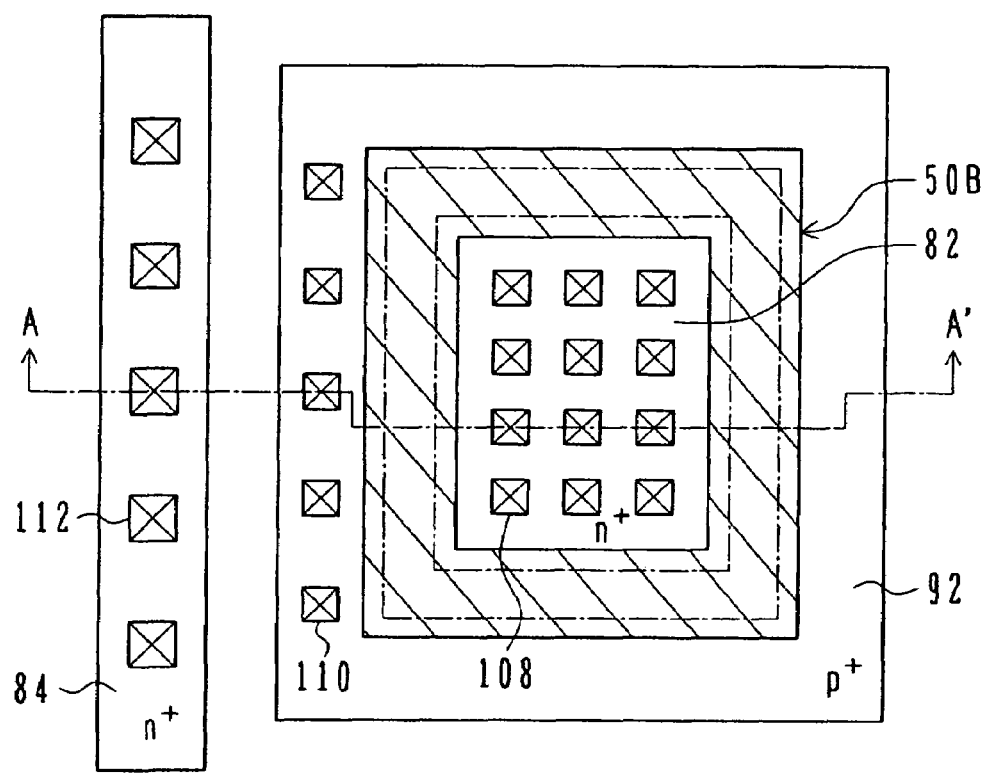
FIGS. 3A to 3C are plan views showing the layout of the junction projection structure and electrodes of the bipolar transistor region shown in FIG. 1.

FIG. 1 shows a bipolar junction transistor region of a BiCMOSIC (an integrated circuit including bipolar junction transistors and CMOS transistors) according to the embodiment of the invention. FIG. 2 is an enlarged view showing a junction protection structure and its nearby region of the bipolar transistor region shown in FIG. 1, and FIG. 3 shows the layout of the junction protection structure and electrodes of the bipolar transistor region shown in FIG. 1. The cross sectional view of FIG. 1 is taken along line A-A' shown in FIG. 3A.

In a principal surface layer of a semiconductor substrate 30 made of, for example, p-type silicon, an n-type collector region 33 is formed and a p-type isolation (element isolation) region 35 is formed surrounding the n-type region 33. A pn junction is formed between the n-type region 33 and p-type substrate 30 and between the n-type region 33 and p-type region 35. The n-type region 33 is formed by using the same process as an ion implantation process of forming an n-type well for a p-channel MOS transistor in a CMOS transistor area. The p-type region 35 is formed by using the same process as an ion implantation process of forming a p-type well for an n-channel MOS transistor in the CMOS transistor area. The p-type region of the p-type substrate is not required to cover the whole region of the substrate, but it is sufficient if the p-type region has at least a thickness allowing BiCMOSIC to be formed on one principal surface side.

A field insulating film 38 of silicon oxide is formed on the principal surface of the substrate 30, the field insulating film 38 has a base aperture 38c and a collector contact hole 38d. For example, the insulating film 38 is formed by using the same process as a LOCOS process of forming a field insulating film in the CMOS transistor area. The field insulating film may be formed by another method, i.e., a trench isolation (TI) method by which a trench is formed in a principal surface layer of the substrate 30 and an insulating film such as silicon oxide is buried in the trench by chemical vapor deposition (CVD).

A p-type base region 44 is formed in a portion of the collector region 33 by an ion implantation process, the portion corresponding to the base aperture 38c of the insulating film 38. A junction protection structure 50B is formed on the surface of the base region 44, surrounding a portion (where an emitter region is to be formed) of the base region 44 in a closed loop configuration.

The junction protection structure 50B comprises as shown in FIG. 2: an insulating thin film 40c of silicon oxide or the like; a conductive layer 50 of doped polysilicon or the like formed on the insulating thin film 40c; and insulating side wall spacers 72 and 74 covering inner and outer walls of the conductive layer 50 and formed on the insulating thin film 40c. The insulating thin film 40c, conductive layer 50 and side wall spacers 72 and 74 are formed by using the same processes as a gate insulating film forming process, a gate electrode forming process and a side wall spacer forming process used in the CMOS transistor area.

An $n^+$-type emitter region 82 is formed in a portion of the base region 44 within the junction protection structure 50B, by using the junction protection cover 50B as an impurity doping mask (in a self-alignment manner relative to the junction protection structure 50B). An emitter-base pn junction between the emitter region 82 and base region 44 terminates at the bottom surface of the insulating thin film 40c of the junction protection structure 50B, as shown in FIGS. 1 and 2. In other words, the emitter-base junction at the substrate surface is covered with and protected by the junction protection structure 50B. An $n^+$-type collector contact region 84 is formed in another portion of the collector region 33, in an area corresponding to the collector contact hole 38d of the insulating film 38. The $n^+$-type regions 82 and 84 are formed by using the same process as an ion implantation process of forming $n^+$-type source/drain regions of an n-channel MOS transistor in the CMOS transistor area.

A $p^+$-type base contact region 92 is formed in another portion of the base region 44 outside the junction protection structure 50B, by using the junction protection structure 50B as an impurity doping mask (in a self-alignment manner relative to the junction protection structure 50B). The $p^+$-type region 92 is formed by using the same ion implantation process of forming $p^+$-type source/drain regions of a p-channel MOS transistor in the CMOS transistor area, to have a higher impurity concentration than that of the base region 44.

On the principal surface of the substrate 30, an interlayer insulating film 94 of silicon oxide or the like is formed covering the insulating film 38, junction protection structure 50B, $n^+$-type regions 82 and 84 and $p^+$-type region 92. The insulating film 94 has contact holes formed therethrough, in the areas corresponding to the emitter region 82, collector contact region 84 and base contact region 92.

An emitter electrode 108 is connected to the emitter region 82 via corresponding contact holes. The emitter electrode 108 is made of one layer on the insulating film, and connected to the emitter region 82 in 3×4=12 areas as shown in FIG. 3A. A base electrode 110 is connected to the base contact region 92 via corresponding contact holes. The base electrode 110 is made of one layer on the insulating film 94, and connected to the base contact region 92 in five areas as shown in FIG. 3A. The number of contact areas of the base electrode 110 may be increased to dispose them surrounding the junction protection structure 50B. A collector electrode 112 is connected to the collector contact region 84 via corresponding contact holes. The collector electrode 112 is made of one layer on the insulating film 94 and connected to the collector contact region 84 in five areas as shown in FIG. 3A. The number of contacts between semiconductor and each electrode can be increased or decreased as desired, and it is preferable to use a plurality of contacts.

A contact hole is formed through the insulating film 94 in an area corresponding to a partial surface area of the conductive layer 50 of the junction protection structure 50B. A wiring 114 electrically connects the conductive layer 50 to the base electrode 110 via the contact hole. A surface protective film 200 of silicon oxide, silicon nitride or the like is formed on the insulating film 94, covering electrodes 108 to 112 and wiring 114.

In forming the bipolar junction transistor, the emitter region 82 is formed by using as the impurity doping mask the junction protection structure 50B having the closed loop configuration, and the emitter-base pn junction is terminated at the bottom surface of the insulating thin film 40c of the junction protection structure 50B. Even if a portion (where the emitter region is to be formed) of the base region 44 within the junction protection structure 50B is exposed to dry etching, the region just under the junction protection structure 50B is shaded from dry etching. Leak current at the emitter-base pn junction can therefore be reduced.

Even if boron is used as the conductivity type determining impurities when the base region 44 is formed, a precipitation phenomenon does not occur when the junction protection structure 50B is formed above the base region 44. Therefore, the impurity concentration of the base region 44 does not lower. In this state the base contact region 92 having a higher impurity concentration is formed by using the junction protection structure 50B as an impurity doping mask, so that the base resistance can be lowered.

Furthermore, the conductive layer 50 of the junction protection structure 50B is connected to the base contact region 92 via the wiring 114 and base electrode 110, so that the conductive layer 50 can be set substantially to the same potential as that of the base region 44 and a conductive channel is prevented from being formed in a semiconductor surface layer just under the conductive layer 50.

Figure 3B:
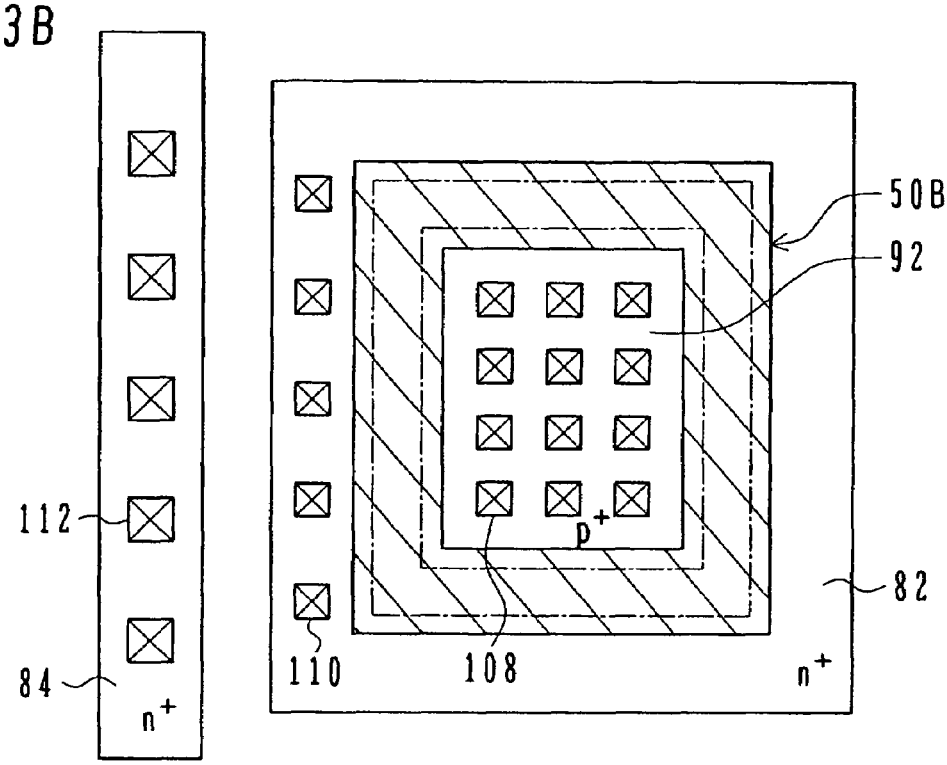

As shown in FIG. 3B, the positions of the emitter region 82 and the base contact region 92 may be reversed. Namely, in place of the base contact region 92, an n$^+$-type emitter region is formed outside the junction protection structure 50B, and in place of the emitter region 82, a p$^+$-type base contact region is formed inside the junction protection structure. In this case, the emitter-base pn junction terminates at the bottom surface of the insulating thin film 40c of the junction protection structure 50B and at the bottom surface of the field insulating film 38. The electrode 108 is used as the base electrode and this base electrode is connected to the conductive layer 50 via the wiring 14. The electrode 110 is used as the emitter electrode and a number of contacts of the emitter electrodes are disposed being surrounded by the junction protection structure 50B.

Figure 3C:
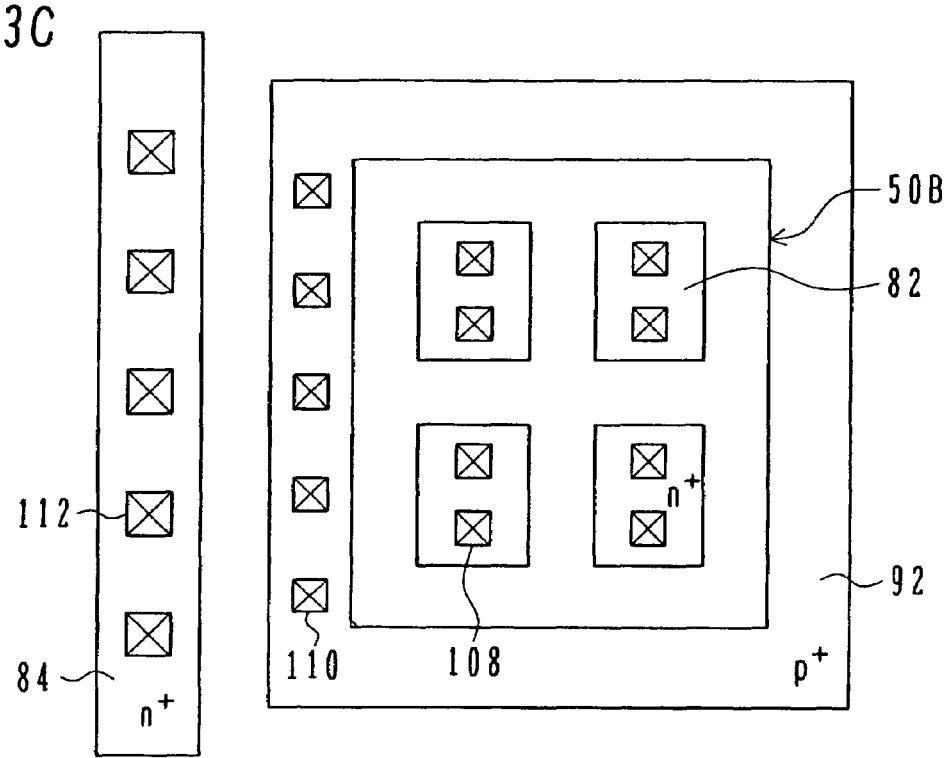

As shown in FIG. 3C, the junction protection structure 50B may have a closed network configuration defining a plurality of regions to form a plurality of n$^+$-type emitter regions 82. With this configuration, a multi-emitter type bipolar junction transistor can be realized.

Next, with reference to FIGS. 4A to 10, description will be made on a method of manufacturing a bipolar junction transistor shown in FIG. 1 in conjunction with a CMOS transistor manufacture method. FIGS. 4A, 5, and 6A to 9A show the bipolar junction transistor shown in FIG. 1, and FIGS. 4B, 6B to 6D, and 7B to 9B show a CMOS transistor.

In the process shown in FIGS. 4A and 4B, after a p-type silicon semiconductor substrate 30 is prepared, an n-type well 32 is formed in the substrate 30 from one principal surface thereof by an ion implantation process, as shown in FIG. 4B, and simultaneously with this, an n-type collector region 33 is formed in the substrate 30 from the principal surface thereof by using the same ion implantation process, as shown in FIG. 4A. A p-type well 34 is formed in the substrate 30 by an ion implantation process as shown in FIG. 4B, and simultaneously with this, a p-type isolation region 35 is formed surrounding the collector region 33 in contact therewith by using the same ion implantation process.

Next, the principal surface of the substrate 30 is subjected to LOCOS to form a field oxide film 38 of silicon oxide. The field oxide film 38 has transistor apertures 38a and 38b corresponding to the wells 32 and 34 in the CMOS transistor area shown in FIG. 4B, and a base aperture 38c corresponding to a portion of the collector region 33 and a collector contact aperture 38d corresponding to another portion of the collector region 33 in the bipolar junction transistor area shown in FIG. 4A.

Thereafter, the principal surface of the substrate 30 is subjected to a thermal oxidation process to form gate insulating films 40a and 40b of silicon oxide on the semiconductor surface in the apertures 38a and 38b in the CMOS transistor area shown in FIG. 4B, and simultaneously with this, the principal surface of the substrate 30 is subjected to the same thermal oxidation process to form insulating thin films 40c and 40d of silicon oxide on the semiconductor surface in the apertures 38c and 38d in the bipolar junction transistor area shown in FIG. 4A.

Figure 5:
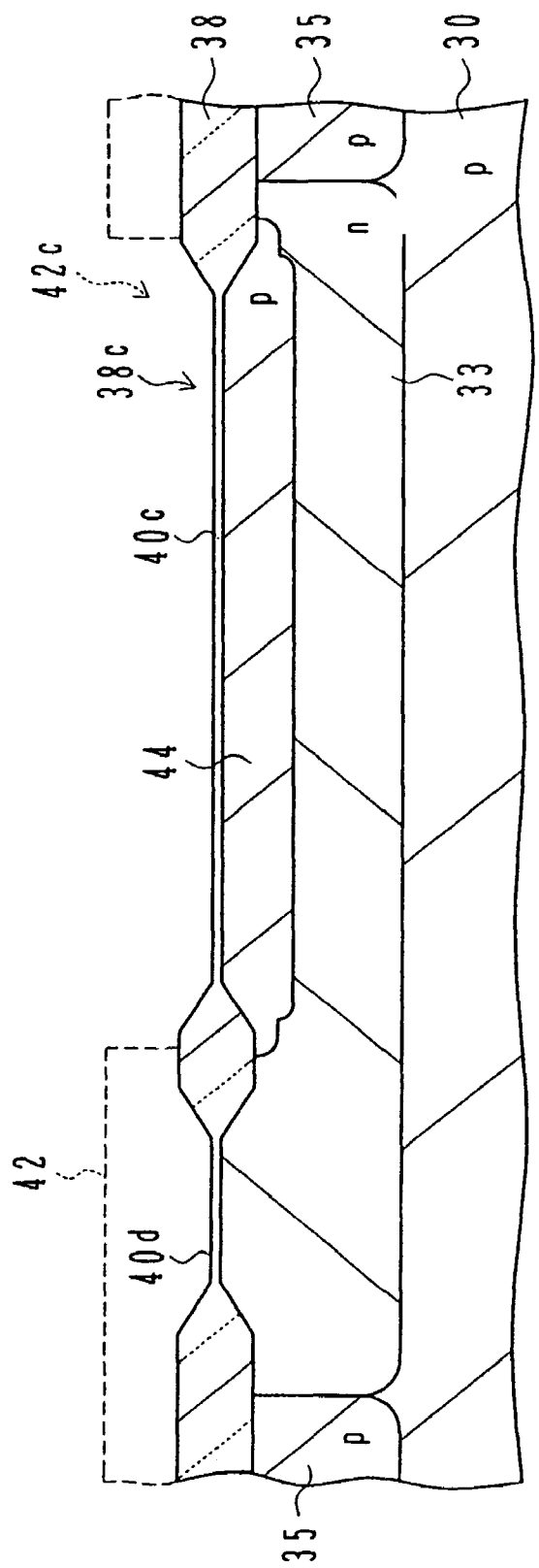

In the process shown in FIG. 5, a photoresist layer 42 is formed on the upper surface of the substrate 30 by a photolithography process, the photoresist layer 42 having an aperture 42c exposing the base aperture 38c and a portion of the insulating film 38 in the peripheral area of the base aperture 38c. In the CMOS transistor area, as shown in FIG. 4B the photoresist layer 42 covers the transistor apertures 38a and 38b and insulating film 38. A boron (p-type conductivity determining impurity) ion implantation process is executed by using the photoresist layer 42 as an impurity doping mask to form a p-type base region 44 in a portion of the collector region 33 corresponding to the base aperture 38c. The photoresist layer 42 is thereafter removed. The base region 44 is relatively deep in a central area because boron ions are implanted via the insulating thin film 40c, and relatively shallow in a peripheral area because boron ions are implanted via the thick insulating film 38.

In the process shown in FIG. 6A, after a polysilicon layer is deposited on the upper surface of the substrate 30 by CVD, the polysilicon layer is patterned by a dry etching process using a resist layer 52 as a mask. In the CMOS transistor area shown in FIG. 6B, therefore, gate electrode layers 46 and 48 made of the left polysilicon layers are formed on the gate insulating films 40a and 40b. Simultaneously with this, in the bipolar junction transistor area shown in FIG. 6A, a conductive layer 50 made of the left polysilicon layer is formed on the insulating film 40c by using the same processes as the CVD process and the photolithography/dry etching process used in the CMOS transistor area. The conductive layer 50 has a closed loop configuration surrounding a portion of the base region 44.

As shown in FIG. 6C, in the CMOS transistor region, the resist layer 52 formed on the substrate 30 has an aperture 52b corresponding to the transistor aperture 38b, and as shown in FIG. 6A, in the bipolar junction transistor area the resist layer 52 covers the base aperture 38c, collector aperture 38d and insulating film 38. In the process shown in FIG. 6C, by using as an impurity doping mask a lamination layer of the gate electrode layer 48 and gate insulating film 40b and the insulating film 38, a phosphorus (n-type conductivity determining impurity) ion implantation process is executed to form an ne-type source region 54 and an n$^-$-type drain region 56 in a surface layer of the p-type well 34 on both sides of the gate electrode layer 48. During this process, since phosphorus is doped into the gate electrode layer (polysilicon layer) 48, the resistance of the electrode layer 48 is lowered slightly. The resist layer 52 is removed thereafter. The drain region is generally called an LDD region. In the phosphorus ion implantation process, phosphorus may be doped also into the conductive layer (polysilicon layer) 50 in the bipolar junction transistor area.

In the process shown in FIG. 6D, a resist layer 58 is formed on the upper surface of the substrate 30 by a photolithography process, the resist layer 58 having an aperture 58a corresponding to the transistor aperture 38a. In the bipolar junction transistor area, as shown in FIG. 6A, the resist layer 58 covers the upper surface of the substrate 30, similar to the resist layer 52. By using as an impurity doping mask a lamination of the gate electrode layer 46 and gate insulating film 40a, and the insulating film 38, a BF$_2$ (p-type conductivity determining impurity) ion implantation process is executed to form a p$^-$-type source region 60 and a p$^-$-type drain region 62 in the surface layer of the n-type well 32 on both sides of the gate electrode layer 46. In this case, since BF$_2$ is doped into the gate electrode layer (polysilicon layer) 46, the resistance of the electrode layer 46 is lowered slightly. The resist layer 58 is thereafter removed. The drain region 62 is generally called an LDD region.

Figure 7A:
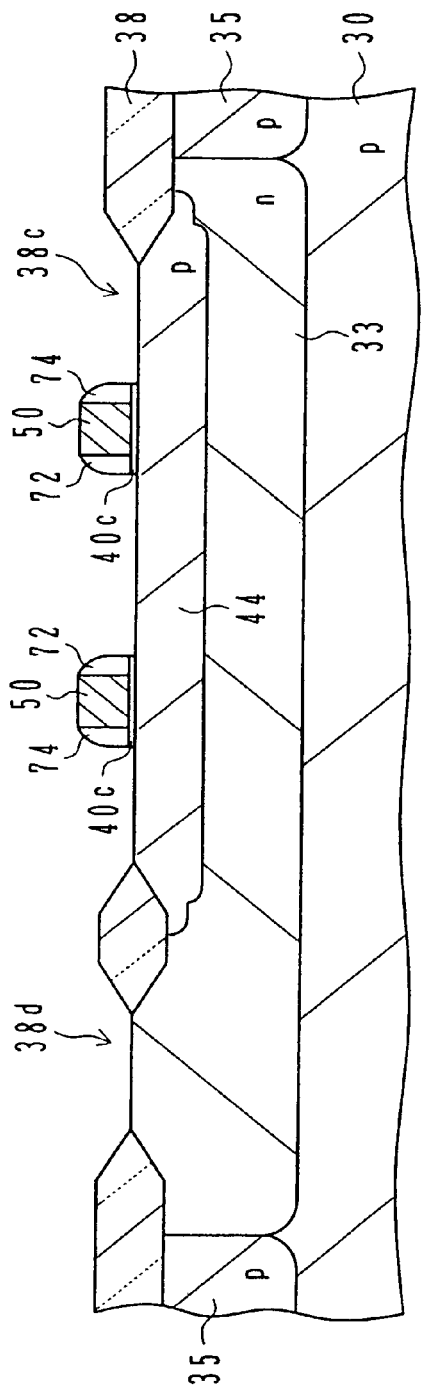
Figure 7B:
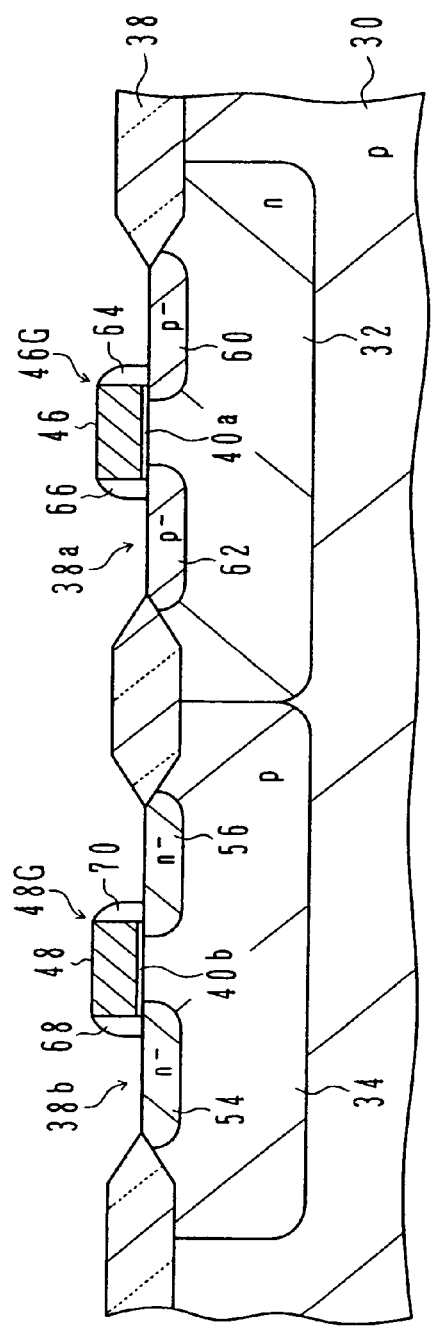

Next, in the process shown in FIG. 7A, after a silicon oxide layer is deposited by CVD on the upper surface of the substrate 30, the silicon oxide layer is etched back by a dry etching process. Therefore, in the CMOS transistor area shown in FIG. 7B, insulating side wall spacers 64, 66, 68 and 70 made of the left silicon oxide layers are formed, and simultaneously with this, in the bipolar junction transistor area shown in FIG. 7A, insulating side wall spacers 72 and 74 are formed by using the same processes as the silicon oxide depositing process and dry etching process used for the CMOS transistor area. In this dry etching process, the gate insulating film 40a is etched to leave a gate insulating film portion on which the gate electrode layer 46 and side wall spacers 64 and 66 are stacked within the transistor aperture 38a, the gate insulating film 40b is etched to leave a gate insulating film portion on which the gate electrode layer 48 and side wall spacers 68 and 70 are stacked within the transistor aperture 38b, and the insulating thin film 40c is etched to leave an insulating thin film portion on which the conductive layer 50 and side wall spacers 72 and 74 are stacked within the base aperture 38c.

The side wall spacers 64 and 66 formed on the gate insulating film 40a cover the side walls of the gate electrode layer 46. The structure including the gate insulating film 40a, gate electrode layer 46 and side wall spacers 64 and 66 is hereinafter expressed as a gate electrode structure 46G. The gate electrode structure 46G is disposed within the transistor aperture 38a, traversing the well 32. The side wall spacers 68 and 70 formed on the gate insulating film 40b cover the side walls of the gate electrode layer 48. The structure including the gate insulating film 40b, gate electrode layer 48 and side wall spacers 68 and 70 is hereinafter expressed as a gate electrode structure 48G. The gate electrode structure 48G is disposed within the transistor aperture 38b, traversing the well 34. The side wall spacers 72 and 74 formed on the gate insulating film 40c cover the side walls of the conductive layers 50 and are formed in a closed loop configuration. The structure including the insulating thin film 40c, conductive layer 50 and side wall spacers 72 and 74 is hereinafter expressed as a junction protection structure 50B. The junction protection structure 50B is formed in a closed loop configuration surrounding a portion of the base region 44 within the base aperture 38c.

Next, in the process shown in FIG. 8A, a resist layer 76 is formed on the upper surface of the substrate 30 by a photolithography process. The resist layer has an aperture 76b corresponding to the transistor aperture 38b as shown in FIG. 8B, and as shown in FIG. 8A an aperture 76c corresponding to an inner aperture 50b (a portion of the base aperture 38c) of the junction protection structure 50B and an aperture 76d corresponding to the collector contact hole 38d. The aperture 76c of the resist layer 76 is formed so that the conductive layer 50 of the junction protection structure 50B is exposed. By using as an impurity doping mask the resist layer 76, gate electrode structure 48G, junction protection structure 50B and insulating film 38, an arsenic (n-type conductivity determining impurity) ion implantation process is executed. Therefore, in the CMOS transistor area shown in FIG. 8B, an n$^+$-type source region 78 and an n$^+$-type drain region 80 overlapping the n$^-$-type source region 54 and the n$^-$-type drain region 56 respectively are formed on both sides of the gate electrode structure 48G. In the bipolar junction transistor area shown in FIG. 8A, an n$^+$-type emitter region 82 is formed in a portion of the base region 44 in an area corresponding to the inner aperture 50b of the junction protection structure 50B, and an n$^+$-type collector contact region 84 is formed in an area corresponding to the collector contact aperture 38d, respectively by using the same process as the ion implantation process used for the CMOS transistor area. The pn junction between the emitter region 82 and base region 44 terminates at the bottom surface of the insulating thin film 40c of the junction protection structure 50B after heat treatment for implanted ion activation. Since arsenic is doped into the gate electrode layer 48 of the junction protection structure 50B and the conductive layer (polysilicon layer) 50 of the junction protection structure 50B, the resistances of the electrode layer 48 and conductive layer 50 are lowered. The resist layer 76 is thereafter removed.

Figure 9A:
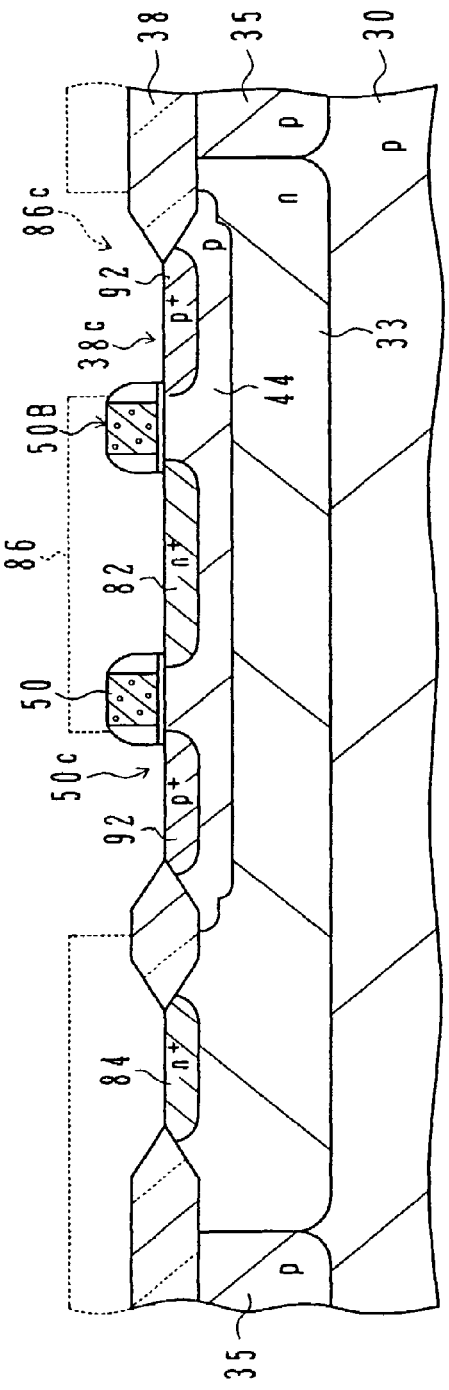
Figure 9B:
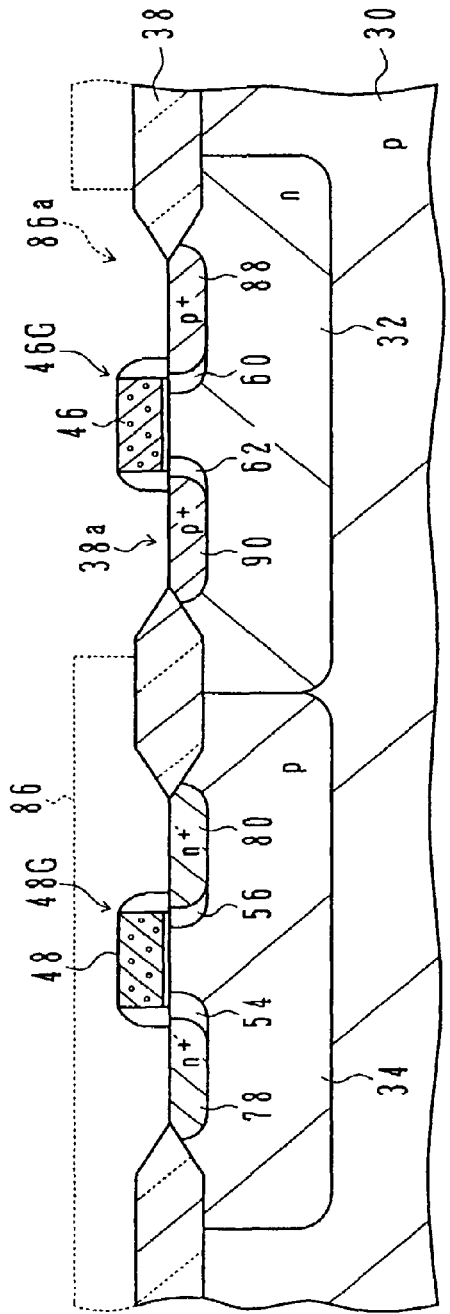

In the process shown in FIG. 9A, a resist layer 86 is formed on the upper surface of the substrate 30 by a photolithography process, the resist layer having an aperture 86a corresponding to the transistor aperture 38a as shown in FIG. 9B and an aperture 86c corresponding to an outer aperture 50c (another portion of the base aperture 38c) of the junction protection structure 50B as shown in FIG. 9A. By using as an impurity doping mask the resist layer 86, gate electrode structure 46G, junction protection structure 50B and insulating film 38, a BF$_2$ ion implantation process is executed. Therefore, in the CMOS transistor area shown in FIG. 9B, a p$^+$-type source region 88 and a p⁺-type drain region 90 overlapping the p⁻-type source region 60 and the p⁻-type drain region 62 respectively are formed on both sides of the gate electrode structure 46G. In the bipolar junction transistor area shown in FIG. 9A, a p⁺-type base contact region 92 is formed in another portion of the base region 44 in an area corresponding to the outer aperture 50c of the junction protection structure 50B, by using the same process as the ion implantation process used for the CMOS transistor area. Since $BF_2$ is doped into the gate electrode layer 46 of the gate electrode structure 46G, the resistance of the electrode layer 46 is lowered. The resist layer 86 is thereafter removed.

Figure 10:
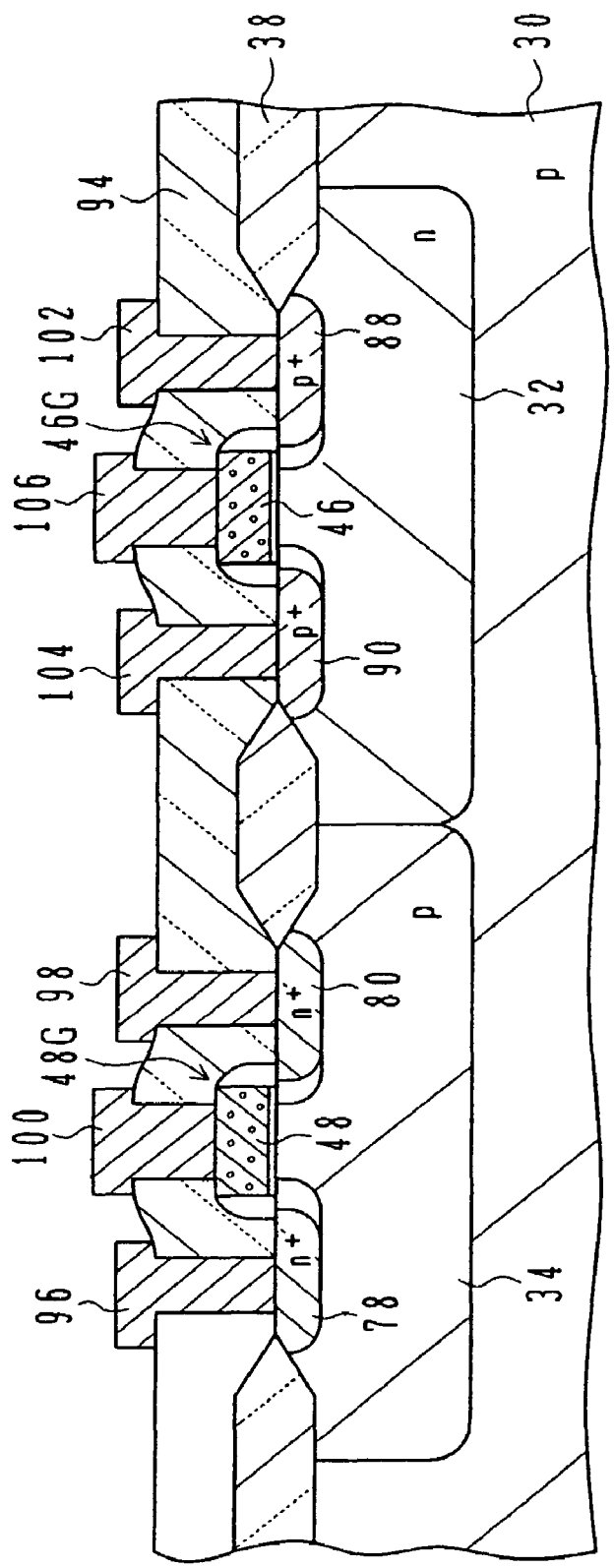

Next, in the process shown in FIG. 10 (refer also to FIG. 1), an interlayer insulating film 94 of silicon oxide or the like is formed on the upper surface of the substrate 30 by CVD, the interlayer insulating film covering the insulating film 38, gate electrode structures 48G, junction protection structure 50B, n⁺-type regions 78, 80, 82 and 84 and p⁺-type regions 88, 90 and 92. Contact holes are formed through the insulating film 94 by a dry etching process using a resist layer as a mask, the contact holes being formed in the areas corresponding to the source regions 78 and 88, drain regions 80 and 90, gate electrode layers 46 and 48, emitter region 82, base contact region 92, collector contact region 84 and conductive layer 50.

After a conductive layer such as Al-containing alloy is deposited on the upper surface of the substrate 30 by sputtering or the like, the conductive layer is patterned by a dry etching process using a resist layer as a mask to form source electrodes 96 and 102, drain electrodes 98 and 104, gate wirings 100 and 106, an emitter electrode 108, a base electrode 110, a collector electrode 112 and a wiring 114. The source electrodes 96 and 102 are connected to the source regions 78 and 88 respectively, via the corresponding contact holes. The drain electrode 98 and 104 are connected to the drain regions 80 and 90 respectively, via the corresponding contact holes. The gate wirings 100 and 106 are connected to the gate electrode layers 48 and 46 respectively, via the corresponding contact holes. The emitter electrode 108, base electrode 110 and collector electrode 112 are connected to the emitter region 82, base contact region 92 and collector contact region 84 respectively, via the corresponding contact holes. The wiring 114 is connected to the conductive layer 84 via the corresponding contact hole so that the conductive layer 50 is connected to the base electrode 110.

According to the bipolar junction transistor manufacture method described above, only the base region forming process shown in FIG. 5 is a process specific to the bipolar junction transistor manufacture method, and the other processes are the same as the CMOS transistor manufacture processes so that the number of processes can be reduced considerably.

Figure 11:
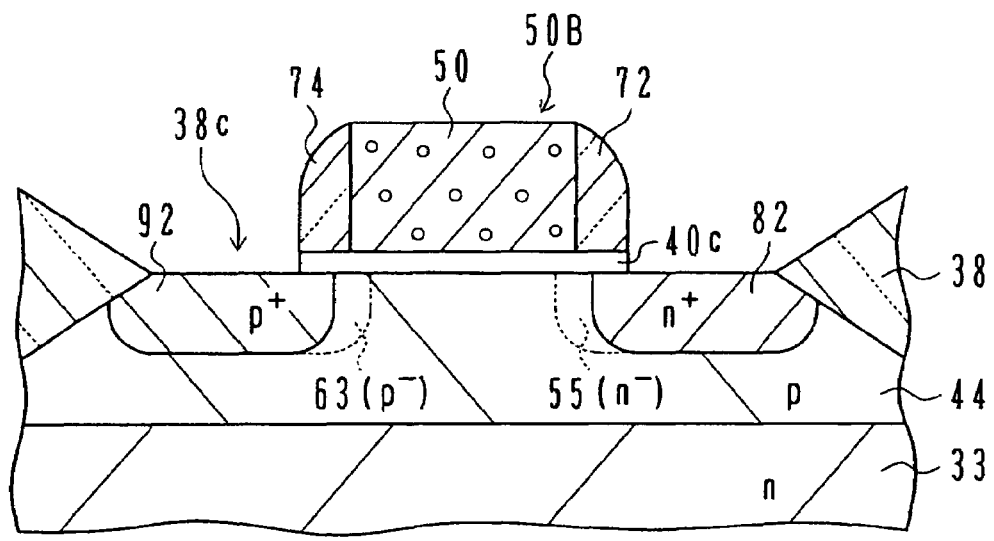
FIG. 11 is a cross sectional view showing a modification of an emitter region and a base contact region.

FIG. 11 shows a modification of the emitter region and base contact region. In FIG. 11, like elements to those shown in FIGS. 1 and 2 are represented by identical reference numerals and the description thereof is omitted.

The different points of the bipolar junction transistor shown in FIG. 11 from that shown in FIGS. 1 and 2 reside in that a junction protection structure 50B is formed within a base aperture 38c of a field insulating film 38, traversing a base region, and that an n⁺-type emitter region 82 and a p⁺-type base contact region 92 are formed by using the junction protection structure 50B as an impurity doping mask (in a self-alignment manner relative to the junction protection structure 50B).

An insulating thin film 40c, a conductive layer 50 and side wall spacers 72 and 74 of the junction protection structure 50B are all formed traversing the base region. The emitter region 82 and base contact region 92 are formed in portions of the base region on both sides of the junction protection structure 50B.

The pn junction between the emitter region 82 and base region 44 terminates at the bottom surface of the insulating thin film 40c of the junction protection structure 50B and at the bottom surface of the insulating film 38. Therefore, even if a portion (where the emitter region is to be formed) of the base region 44 on one side of the junction protection structure 50B is exposed to dry etching while the side wall spacers 72 and 74 are formed, a region just under the junction protection structure 50B and a region just under the insulating film 38 can be protected from dry etching. Leak current at the emitter-base pn junction can therefore be reduced.

Even if boron is used as the conductivity type determining impurities when the base region 44 is formed, a precipitation phenomenon does not occur when the junction protection structure 50B is formed above the base region 44. Therefore, the impurity concentration of the base region 44 does not lower. In this state the base contact region 92 having a higher impurity concentration is formed by using the junction protection structure 50B as an impurity doping mask, so that the base resistance can be lowered.

Furthermore, the conductive layer 50 of the junction protection structure 50B is connected to the base contact region 92 via the wiring 114 and base electrode 110 similar to that shown in FIG. 1, so that the conductive layer 50 can be set substantially to the same potential as that of the base region 44 and a conductive channel is prevented from being formed in a semiconductor surface layer just under the conductive layer 50.

In manufacturing the bipolar junction transistor shown in FIG. 11, the pattern of the junction protection structure 50B is changed from the closed loop configuration surrounding a portion of the base region 44 to a stripe pattern traversing the base region 44, in the junction protection structure forming process shown in FIGS. 6A and 7A of the bipolar junction transistor manufacture method described with reference to FIGS. 4A to 10. Therefore, the bipolar junction transistor shown in FIG. 11 can be manufactured by using a smaller number of processes similar to the manufacture method described with reference to FIGS. 4A to 10. In the bipolar junction transistor shown in FIG. 11, an integrated structure of the side wall spacers 72 and 74 covers the side wall of the conductive layer 50.

In the bipolar junction transistor shown in FIGS. 1 and 2 or FIG. 11, as shown in FIG. 11 an n⁻-type emitter region 57 may be formed on one side of the emitter region 82 under the junction protection structure 50B and a p⁻-type base contact region 63 may be formed on one side of the base contact region 92 under the junction protection structure 50B. In forming this structure, the resist layer 52 is formed in the process shown in FIG. 6C to have the same impurity doping mask pattern as that of the resist layer 76 shown in FIG. 8A. Thereafter, by using the resist layer 52 as an impurity doping mask, the n⁻-type emitter region 57 and n⁻-type collector contact region (not shown) are formed by using the same process as the phosphorus ion implantation process of forming the n⁻-type regions 54 and 56. Phosphorus is also doped in the conductive layer 50. In the process shown in FIG. 6D, the resist layer 58 is formed to have the same impurity doping mask pattern as that of the resist layer 86 shown in FIG. 9A. Thereafter, by using the resist layer 58 as an impurity doping mask, the p⁻-type base contact region 63 is formed 86 by using the same process as the $BF_2$ ion implantation process of forming the p⁻-type regions 60 and 62.

As the emitter region 57 and base contact region 63 are formed in the manner described above, the photolithography process of forming the resist layer can use the same photo mask in the processes shown in FIG. 8A and 6C, and in the processes shown in FIG. 9A and 6D. The number of photo masks can be reduced by two. Phosphorus ion doping into the conductive layer 50 may be omitted when the n⁻-type region 57 is formed. Either the emitter region 57 or the base contact region 63 may be formed singularly.

Figure 12:
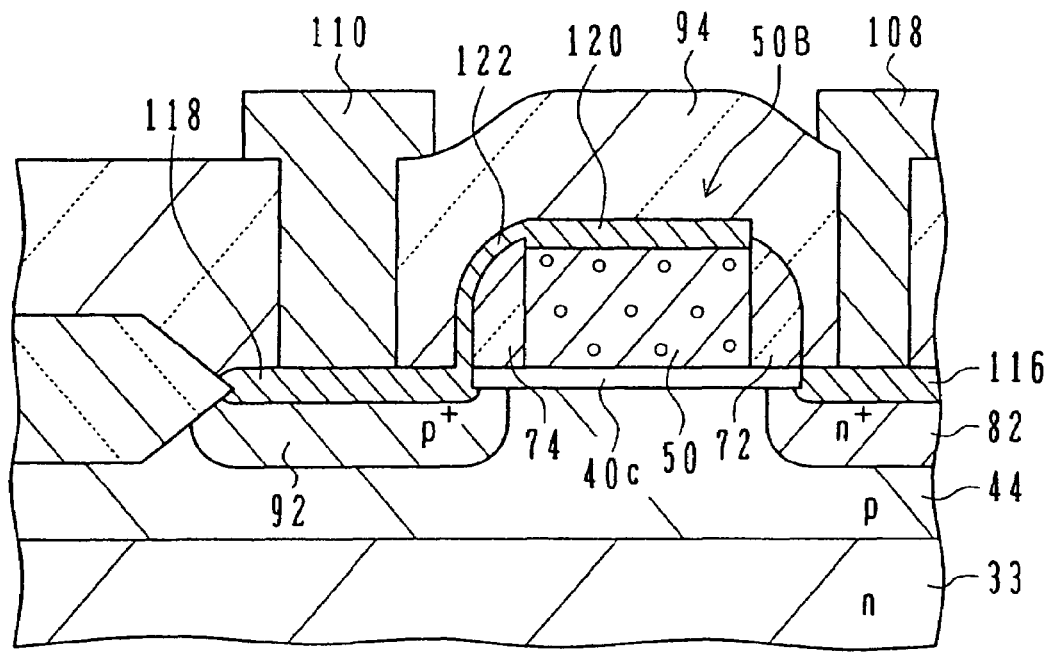
FIG. 12 is a cross sectional view showing a modification of a wiring between the base contact region and the junction protection structure.
Figure 13:
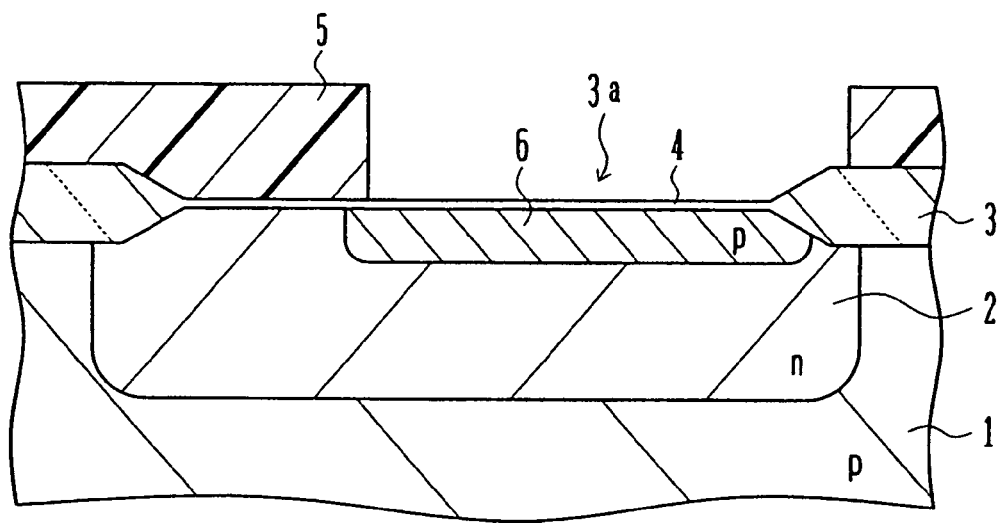
FIG. 13 is a cross sectional view illustrating an active base region forming process of a conventional bipolar junction transistor manufacture method.
Figure 14:
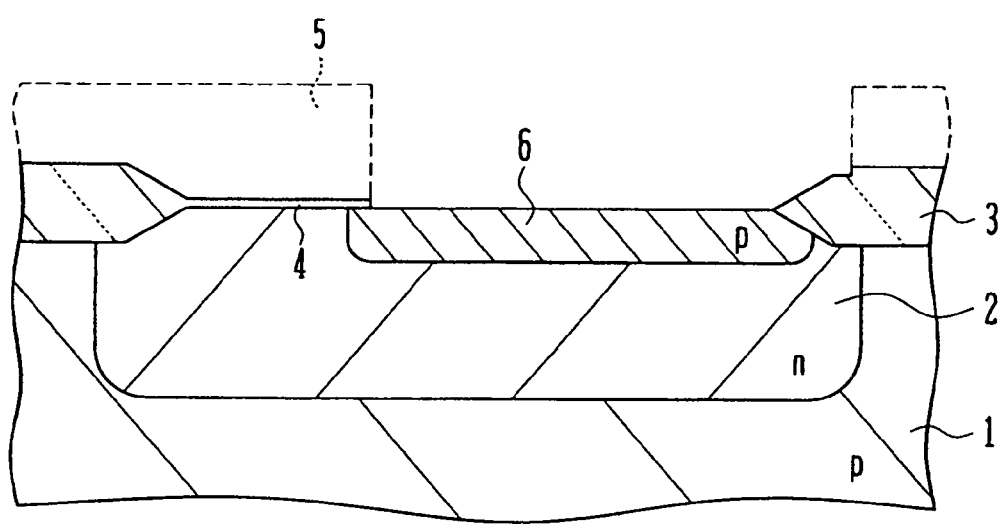
FIG. 14 is a cross sectional view illustrating a LOCOS process following the process shown in FIG. 13.
Figure 15:
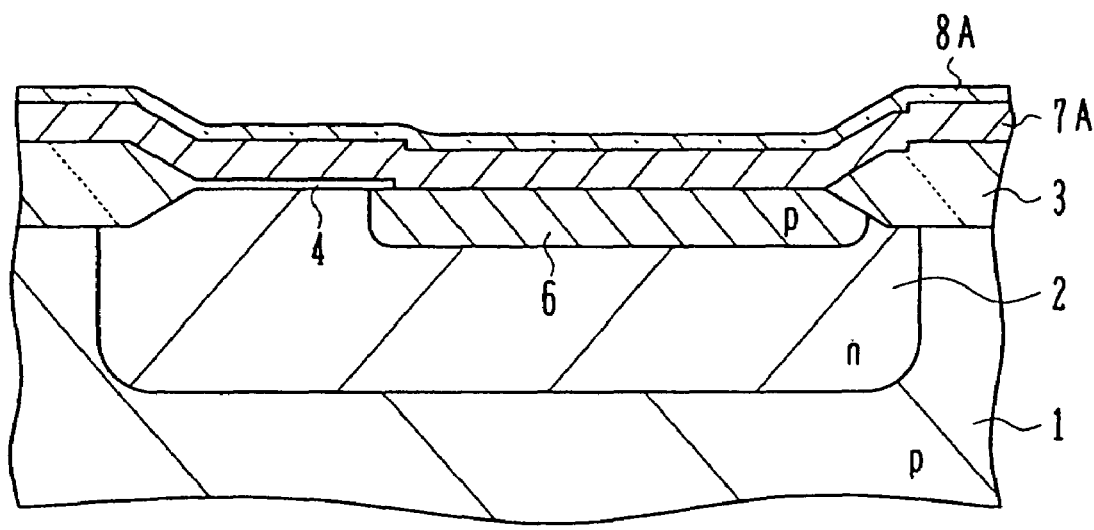
FIG. 15 is a cross sectional view illustrating a polysilicon deposition process and a silicon oxide deposition process following the process shown in FIG. 14.
Figure 16:
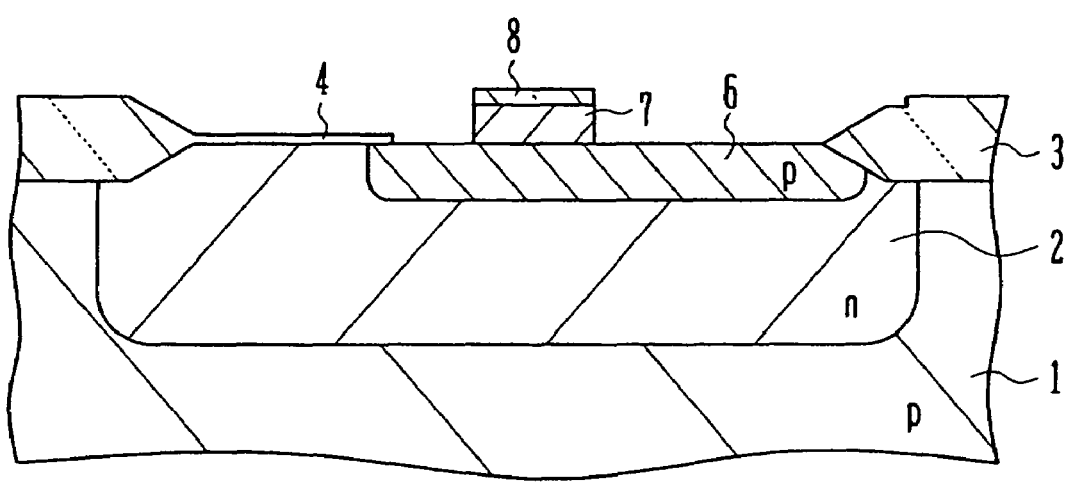
FIG. 16 is a cross sectional view illustrating a patterning process for forming a lamination layer of a silicon oxide layer and a polysilicon layer, following the processes shown in FIG. 15.
Figure 17:
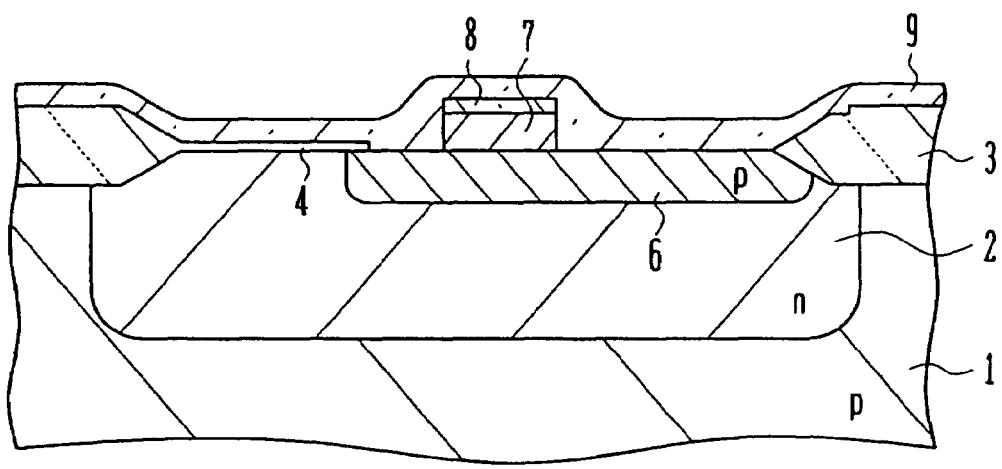
FIG. 17 is a cross sectional view illustrating a silicon oxide deposition process following the process shown in FIG. 16.
Figure 18:
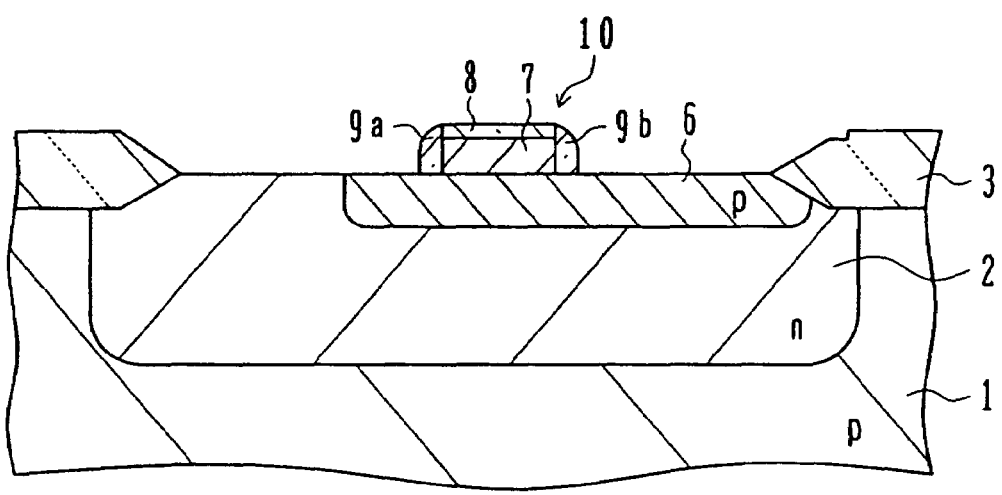
FIG. 18 is a cross sectional view illustrating an etch-back process following the process shown in FIG. 17.
Figure 19:
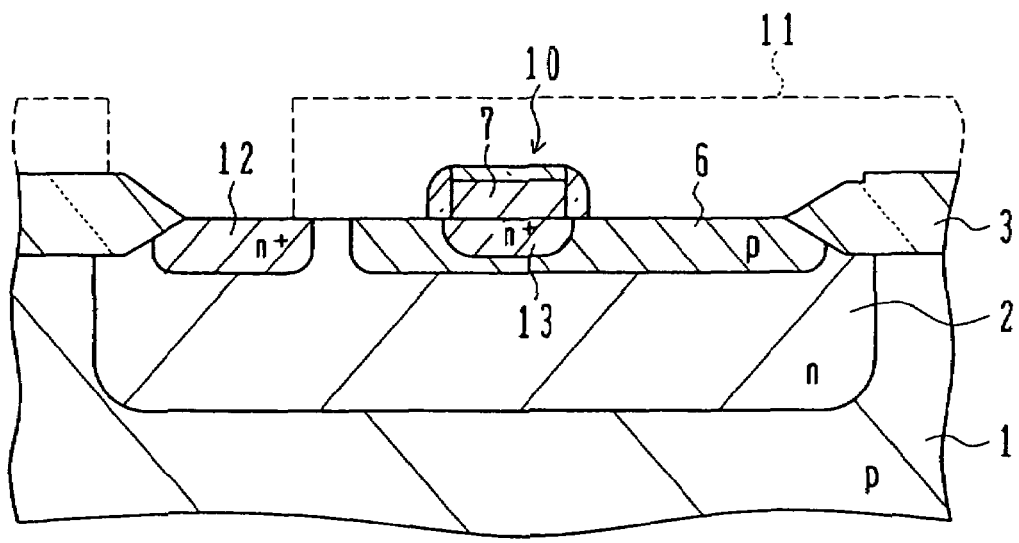
FIG. 19 is a cross sectional view illustrating a process of forming a collector contact region and an emitter region following the process shown in FIG. 18.
Figure 20:
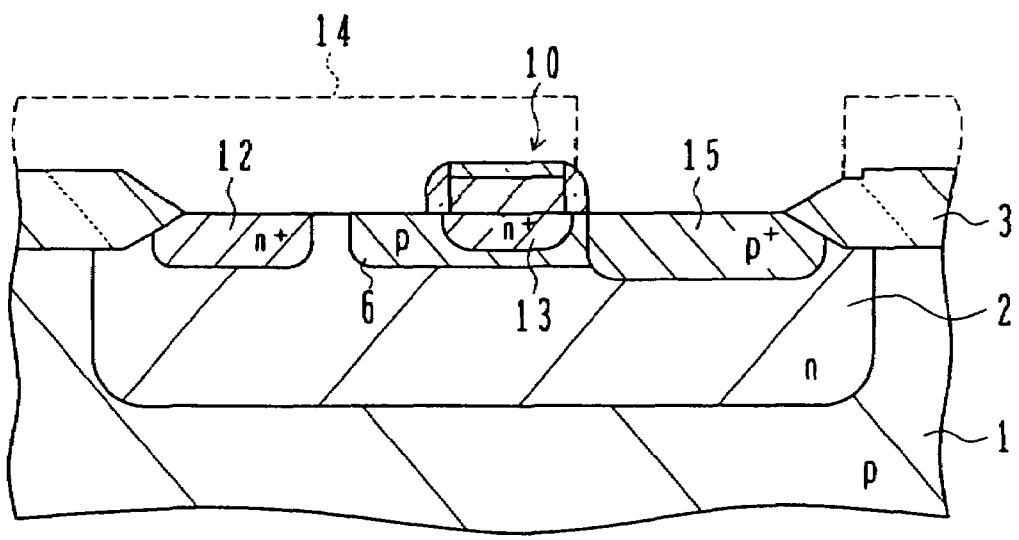
FIG. 20 is a cross sectional view illustrating an external base region forming process following the processes shown in FIG. 19.
Figure 21:
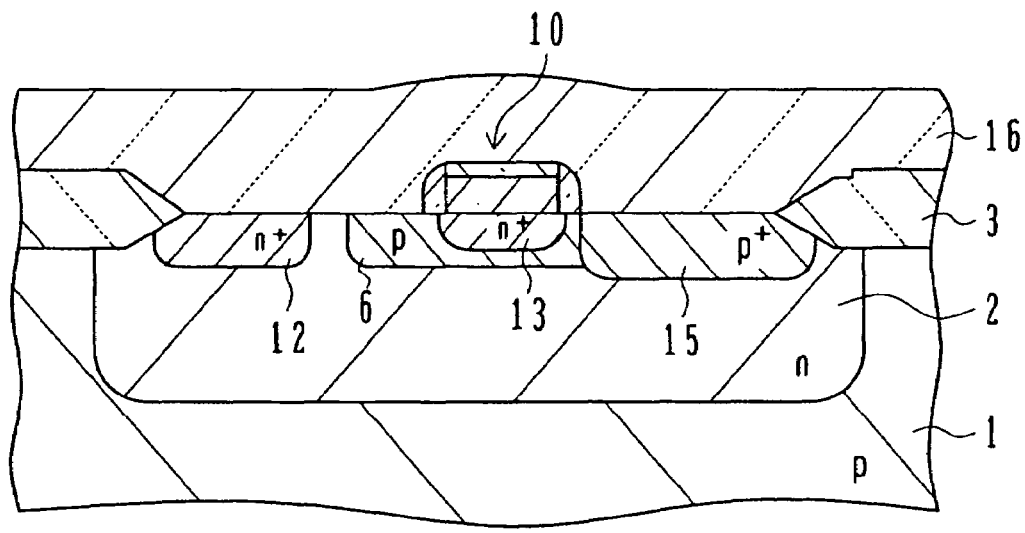
FIG. 21 is a cross sectional view illustrating a silicon oxide deposition process following the process shown in FIG. 20.
Figure 22:
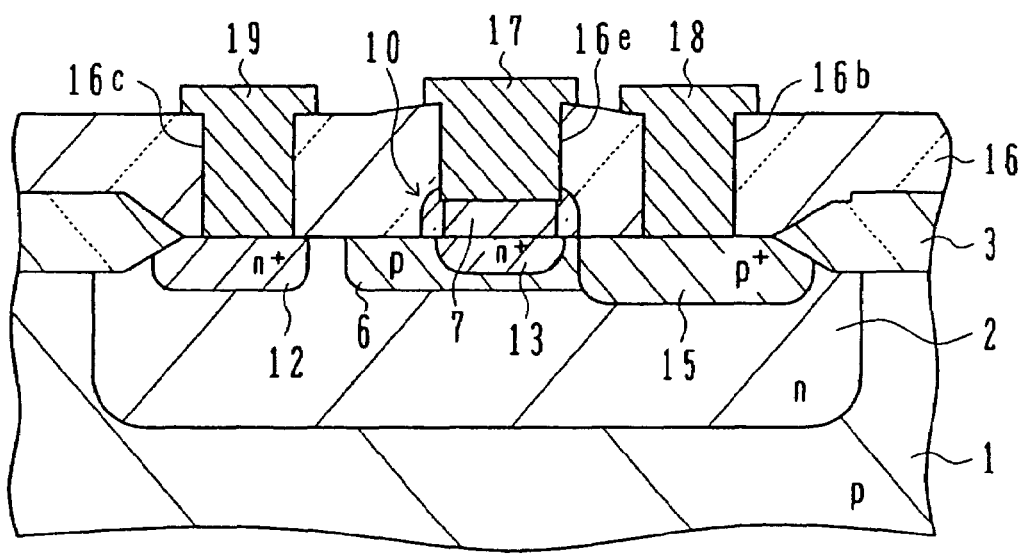
FIG. 22 is a cross sectional view illustrating an electrode forming process following the process shown in FIG. 21.
Figure 23:
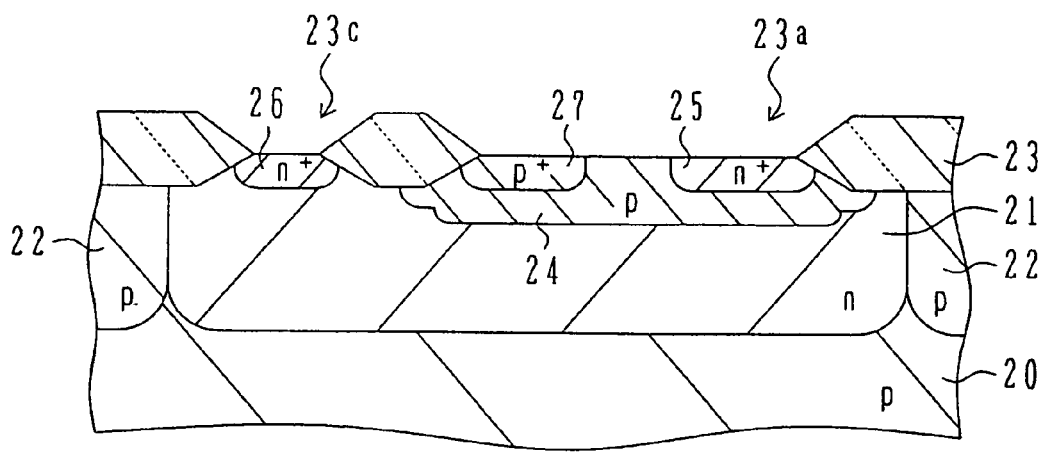
FIG. 23 is a cross sectional view showing an example of a bipolar junction transistor according to the studies made the present inventors.
Figure 24:
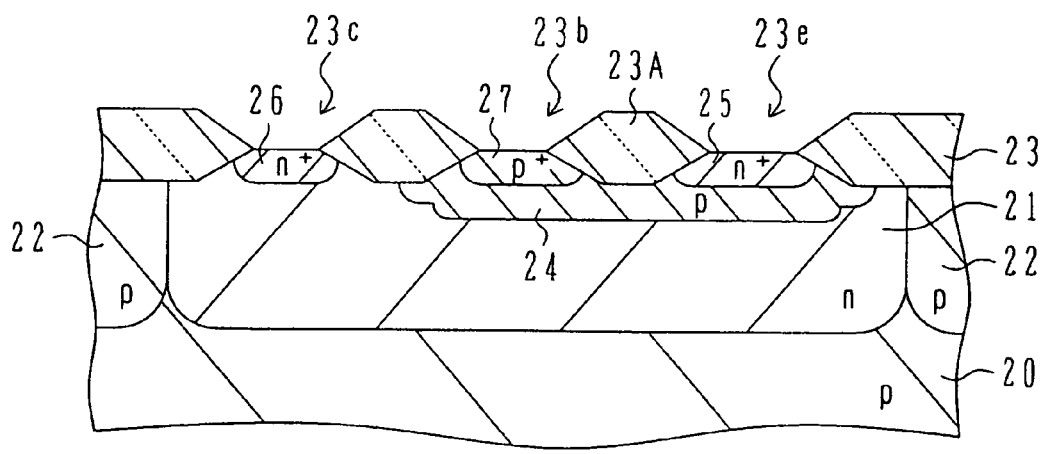
FIG. 24 is a cross sectional view showing another example of a bipolar junction transistor according to the studies made the present inventors.

FIG. 12 shows a modification of a wiring between the base contact region and the junction protection structure. In FIG. 12, like elements to those shown in FIGS. 1 and 2 are represented by identical reference numerals and the description thereof is omitted.

The different points of a bipolar junction transistor shown in FIG. 12 from that shown in FIGS. 1 and 2 reside in that refractory metal silicide layers 116, 118 and 120 of titanium silicide or the like are formed on an emitter region 82, a base contact region 92 and a conductive layer 50 of a junction protection structure 50B, and that the silicide layers 118 and 120 are interconnected by a silicide forming metal layer 122 of titanium or the like to connect an emitter electrode 108 and a base electrode 110 to the silicide layers 116 and 118, respectively. Similar to the wiring 114 of the bipolar junction transistor shown in FIG. 1, it is possible to prevent a conductive channel from being formed in a semiconductor surface layer just under the conductive layer 50. It is also possible to connect the emitter electrode 108 and base electrode 110 to the emitter region 82 and base contact region 92, respectively, at a low contact resistance.

The electrode/wiring structure shown in FIG. 12 can be realized by a salicide process. In the process shown in FIGS. 9A and 9B, after the resist layer 86 is removed, a silicide forming metal layer, e.g., a titanium layer, is deposited on the upper surface of the substrate 30 by sputtering or the like. The substrate 30 is subjectted to heat treatment for silicidation to make the titanium layer react with the gate electrode layers 46 and 48, conductive layer 50, n⁺-type regions 78, 80 and 82, and p⁺-type regions 88, 90 and 92 to form silicide layers. An unreacted silicide forming metal layer is selectively etched and removed to leave the silicide forming metal layer 122 between the silicide layers 118 and 120.

The electrode/wiring structure and salicide process described with reference to FIG. 12 may be applied to the bipolar junction transistor shown in FIG. 11.

The present invention has been described in connection with the preferred embodiments. The invention is not limited only to the above embodiments. It will be apparent to those skilled in the art that other various modifications, improvements, combinations, and the like can be made. For example, the present invention is applicable not only to an npn type bipolar junction transistor but also to a pnp type bipolar junction transistor.

What we claim are:

1. A method of manufacturing a semiconductor device including CMOS transistors and a bipolar junction transistor, comprising the steps of:
    (a) preparing a semiconductor substrate having a principal surface;
    (b-1) forming a collector region of a first conductivity type and a first well of the first conductivity type, simultaneously by ion implantation in the semiconductor substrate from the principal surface;
    (b-2) forming a second well of a second conductivity type opposite to said first conductivity type, in the semiconductor substrate from the principal surface;
    (c) forming a base region of the second conductivity type in the collector region from the principal surface;
    (d) forming first and second insulated gate structure on said first and second wells, and a junction protection structure having same constituent elements as one of said insulated gate structures on said base region;
    (e-1) forming first source/drain regions of the second conductivity type in said first well on both sides of said first insulated gate structure(s); and
    (e-2) forming second source/drain regions of the first conductivity type in said second well on both sides of said second insulated gate structure(s), and an emitter region of the first conductivity type in the base region with an emitter-base junction reaching the principal surface below said junction protection structure, the second source/drain regions and the emitter region being formed simultaneously.

2. The method according to claim 1, further comprising the step of forming a field insulating film having a base aperture above said base region, a collector aperture above said collector region outside said base region, and first and second MOS transistor apertures above said first and second wells.

3. The method according to claim 2, wherein the first and second insulated gate structures and the junction protection structure, each comprising an insulating film formed on the principal surface, a conductive electrode formed on the insulating film, and side wall spacers of insulating material formed on side walls of said conductive electrode.

4. The method according to claim 3, wherein said step (d) comprises the steps of:
    (d-1) forming a gate insulating film on the principal surface of said substrate;
    (d-2) forming a conductive layer on said gate insulating film;
    (d-3) patterning the conductive film to form conductive electrodes with side walls; and
    (d-4) forming side wall spacers on the side walls of said conductive electrodes.

5. The method according to claim 3, wherein said step (d) forms the junction protection structure in a closed loop configuration in the base aperture, and said step (e-2) forms the emitter region in a region surrounded by the closed loop configuration.

6. The method according to claim 3, wherein said step (d) forms the junction protection structure traversing a base region exposed in the base aperture, and said step (e-2) forms the emitter region in a region defined by the junction protection structure and the field insulating film.

7. A method of manufacturing a semiconductor device including CMOS transistors and a bipolar junction transistor, comprising the steps of:
    (a) preparing a semiconductor substrate having a principal surface;
    (b-1) forming a collector region of a first conductivity type and a first well of the first conductivity type, simultaneously in the semiconductor substrate from the principal surface;
    (b-2) forming a second well of a second conductivity type opposite to said first conductivity type, in the semiconductor substrate from the principal surface;
    (c) forming a base region of the second conductivity type in the collector region from the principal surface;
    (d) forming first and second insulated gate structure on said first and second wells, and a junction protection structure having same constituent elements as one of said insulated gate structures on said base region;

(e-1) forming first source/drain regions of the second conductivity type in said first well on both sides of said first insulated gate structure(s);

(e-2) forming second source/drain regions of the first conductivity type in said second well on both sides of said second insulated gate structure(s), and an emitter region of the first conductivity type in the base region with an emitter-base junction reaching the principal surface below said junction protection structure, the second source/drain regions and the emitter region being formed simultaneously; and forming a field insulating film having a base aperture above said base region, a collector aperture above said collector region outside said base region, and first and second MOS transistor apertures above said first and second wells, wherein the first and second insulated gate structures and the junction protection structure, each comprising an insulating film formed on the principal surface, a conductive electrode formed on the insulating film, and side wall spacers of insulating material formed on side walls of said conductive electrode, wherein said step (d) comprises the steps of:
 (d-1) forming a gate insulating film on the principal surface of said substrate;
 (d-2) forming a conductive layer on said gate insulating film;
 (d-3) patterning the conductive film to form conductive electrodes with side walls; and
 (d-4) forming side wall spacers on the side walls of said conductive electrodes, and wherein said step (e-2) comprises the steps of:
 (e-2-1) doping impurity of the first conductivity type into the second well, after said step (d-3) to form lightly doped drain regions; and
 (e-2-2) doping impurity of the first conductivity type into the second well and into the base region to form heavily doped source/drain regions and the emitter region, after said step (d-4).

8. A method of manufacturing a semiconductor device including CMOS transistors and a bipolar junction transistor, comprising the steps of:

(a) preparing a semiconductor substrate having a principal surface;

(b-1) forming a collector region of a first conductivity type and a first well of the first conductivity type, simultaneously in the semiconductor substrate from the principal surface;

(b-2) forming a second well of a second conductivity type opposite to said first conductivity type, in the semiconductor substrate from the principal surface;

(c) forming a base region of the second conductivity type in the collector region from the principal surface;

(d) forming first and second insulated gate structure on said first and second wells, and a junction protection structure having same constituent elements as one of said insulated gate structures on said base region;

(e-1) forming first source/drain regions of the second conductivity type in said first well on both sides of said first insulated gate structure(s);

(e-2) forming second source/drain regions of the first conductivity type in said second well on both sides of said second insulated gate structure(s), and an emitter region of the first conductivity type in the base region with an emitter-base junction reaching the principal surface below said junction protection structure, the second source/drain regions and the emitter region being formed simultaneously; and forming a field insulating film having a base aperture above said base region, a collector aperture above said collector region outside said base region, and first and second MOS transistor apertures above said first and second wells, wherein the first and second insulated gate structures and the junction protection structure, each comprising an insulating film formed on the principal surface, a conductive electrode formed on the insulating film, and side wall spacers of insulating material formed on side walls of said conductive electrode, wherein said step (d) comprises the steps of:
 (d-1) forming a gate insulating film on the principal surface of said substrate;
 (d-2) forming a conductive layer on said gate insulating film;
 (d-3) patterning the conductive film to form conductive electrodes with side walls; and
 (d-4) forming side wall spacers on the side walls of said conductive electrodes, and wherein said step (e-1) comprises the steps of:
 (e-1-1) doping impurity of the second conductivity type into the first well, after said step (d-3) to form lightly doped regions; and
 (e-1-2) doping impurity of the second conductivity type into the first well, to form heavily doped source/drain regions, after said step (d-4).

9. A method of manufacturing a semiconductor device including CMOS transistors and a bipolar junction transistor, comprising the steps of:

(a) preparing a semiconductor substrate having a principal surface;

(b-1) forming a collector region of a first conductivity type and a first well of the first conductivity type, simultaneously in the semiconductor substrate from the principal surface;

(b-2) forming a second well of a second conductivity type opposite to said first conductivity type, in the semiconductor substrate from the principal surface;

(c) forming a base region of the second conductivity type in the collector region from the principal surface;

(d) forming first and second insulated gate structure on said first and second wells, and a junction protection structure having same constituent elements as one of said insulated gate structures on said base region;

(e-1) forming first source/drain regions of the second conductivity type in said first well on both sides of said first insulated gate structure(s);

(e-2) forming second source/drain regions of the first conductivity type in said second well on both sides of said second insulated gate structure(s), and an emitter region of the first conductivity type in the base region with an emitter-base junction reaching the principal surface below said junction protection structure, the second source/drain regions and the emitter region being formed simultaneously; and forming a field insulating film having a base aperture above said base region, a collector aperture above said collector region outside said base region, and first and second MOS transistor apertures above said first and second wells, wherein the first and second insulated gate structures and the junction protection structure, each comprising an insulating film formed on the principal surface, a conductive electrode formed on the insulating film, and side wall spacers of insulating material formed on side walls of said conductive electrode, and wherein said step (d) forms the junction protection structure in a closed loop configuration in the base aperture, and said step (e-2) forms the emitter region in a region between the field insulating film and the closed loop configuration.

10. A method of manufacturing a semiconductor device including CMOS transistors and a bipolar junction transistor, comprising the steps of:

(a) preparing a semiconductor substrate having a principal surface;

(b-1) forming a collector region of a first conductivity type and a first well of the first conductivity type, simultaneously in the semiconductor substrate from the principal surface;

(b-2) forming a second well of a second conductivity type opposite to said first conductivity type, in the semiconductor substrate from the principal surface;

(c) forming a base region of the second conductivity type in the collector region from the principal surface;

(d) forming first and second insulated gate structure on said first and second wells, and a junction protection structure having same constituent elements as one of said insulated gate structures on said base region;

(e-1) forming first source/drain regions of the second conductivity type in said first well on both sides of said first insulated gate structure(s);

(e-2) forming second source/drain regions of the first conductivity type in said second well on both sides of said second insulated gate structure(s), and an emitter region of the first conductivity type in the base region with an emitter-base junction reaching the principal surface below said junction protection structure, the second source/drain regions and the emitter region being formed simultaneously; and forming a field insulating film having a base aperture above said base region, a collector aperture above said collector region outside said base region, and first and second MOS transistor apertures above said first and second wells, wherein the first and second insulated gate structures and the junction protection structure, each comprising an insulating film formed on the principal surface, a conductive electrode formed on the insulating film, and side wall spacers of insulating material formed on side walls of said conductive electrode, and wherein said step (d) forms the junction protection structure of a closed network configuration defining a plurality of areas within the base aperture, and said step (e-2) forms the emitter region in the plurality of areas defined by the closed network configuration with emitter-base junctions reaching the principal surface below the junction protection structure.

11. A method of manufacturing a semiconductor device including CMOS transistors and a bipolar junction transistor, comprising the steps of:

(a) preparing a semiconductor substrate having a principal surface;

(b-1) forming a collector region of a first conductivity type and a first well of the first conductivity type, simultaneously in the semiconductor substrate from the principal surface;

(b-2) forming a second well of a second conductivity type opposite to said first conductivity type, in the semiconductor substrate from the principal surface;

(c) forming a base region of the second conductivity type in the collector region from the principal surface;

(d) forming first and second insulated gate structure on said first and second wells, and a junction protection structure having same constituent elements as one of said insulated gate structures on said base region;

(e-1) forming first source/drain regions of the second conductivity type in said first well on both sides of said first insulated gate structure(s);

(e-2) forming second source/drain regions of the first conductivity type in said second well on both sides of said second insulated gate structure(s), and an emitter region of the first conductivity type in the base region with an emitter-base junction reaching the principal surface below said junction protection structure, the second source/drain regions and the emitter region being formed simultaneously; and forming a field insulating film having a base aperture above said base region, a collector aperture above said collector region outside said base region, and first and second MOS transistor apertures above said first and second wells; and forming a local interconnection electrically connecting the conductive electrode of said junction protection structure and the base region, wherein the first and second insulated gate structures and the junction protection structure, each comprising an insulating film formed on the principal surface, a conductive electrode formed on the insulating film, and side wall spacers of insulating material formed on side walls of said conductive electrode.

12. The method according to claim 11, wherein said semiconductor substrate is formed of silicon, the local interconnection comprises a silicide layer made of silicon and a silicidable metal formed on the base region, and an interconnecting portion made of the silicidable metal, formed on one of the side wall spacers.

* * * * *